United States Patent
Kawaguchi et al.

(10) Patent No.: US 7,038,700 B2
(45) Date of Patent: May 2, 2006

(54) MORPHING METHOD FOR STRUCTURE SHAPE, ITS COMPUTER PROGRAM, AND COMPUTER-READABLE STORAGE MEDIUM

(75) Inventors: Katsuya Kawaguchi, Hiroshima-ken (JP); Masaki Ohji, Hiroshima-ken (JP); Masahiro Hirao, Hiroshima-ken (JP); Mamoru Ohtsuka, Hiroshima-ken (JP); Toshio Takeuchi, Hiroshima-ken (JP)

(73) Assignee: Mazda Motor Corporation, Hiroshima (JP)

( * ) Notice: Subject to any disclaimer, the term of this patent is extended or adjusted under 35 U.S.C. 154(b) by 491 days.

(21) Appl. No.: 10/241,497

(22) Filed: Sep. 12, 2002

(65) Prior Publication Data

US 2003/0058259 A1 Mar. 27, 2003

(30) Foreign Application Priority Data

Sep. 26, 2001 (JP) .................................... 2001-294932

(51) Int. Cl.
G06T 17/00 (2006.01)
G09G 15/00 (2006.01)
G06F 19/00 (2006.01)
G06F 17/50 (2006.01)

(52) U.S. Cl. ................... 345/646; 345/420; 345/423; 716/20; 700/187

(58) Field of Classification Search ................ 715/781; 345/420, 423, 646, 441, 781, 949, 955, 649, 345/475; 716/20
See application file for complete search history.

(56) References Cited

U.S. PATENT DOCUMENTS

| 5,265,040 | A | * | 11/1993 | Saji et al. ................. 716/20 |
| 5,315,537 | A | * | 5/1994 | Blacker ..................... 716/20 |
| 5,619,625 | A | | 4/1997 | Konno et al. ............. 395/119 |
| 6,727,898 | B1 | * | 4/2004 | Hariya et al. ............. 345/420 |
| 6,879,324 | B1 | * | 4/2005 | Hoppe ....................... 345/423 |
| 2002/0175948 | A1 | * | 11/2002 | Nielsen et al. ............ 345/781 |
| 2003/0080957 | A1 | * | 5/2003 | Stewart et al. ............ 345/420 |

FOREIGN PATENT DOCUMENTS

JP  9-106453  4/1997

OTHER PUBLICATIONS

Seungyong Lee et al., "Image Metamorphosis with Scattered Feature Constraints", IEEE Transactions on Visualization and Computer Graphics, vol. 2 No. 4, Dec. 1996, pp. 337–353 (XP 000636823).

* cited by examiner

*Primary Examiner*—Matthew C. Bella
*Assistant Examiner*—Hau Nguyen

(57) ABSTRACT

Upon calculating a FEM model of a new model vehicle as a structure to be analyzed using that of an existing vehicle as a prototype structure, a computer sets a plurality of corresponding reference points on the outline of the new model vehicle and the FEM model of the existing vehicle, changes a mesh model included in the FEM model of the existing vehicle to the outer shape of the new model vehicle on the basis of that mesh model and the correspondence between these reference points, and merges additional information contained in the FEM model of the existing vehicle and its associated state with respect to the deformed mesh model, thus calculating the FEM model of the new model vehicle.

31 Claims, 25 Drawing Sheets

B-BOX1

EXAMPLE ○ : FIRST FEM MODEL REFERENCE POINTS
■ : SECOND FEM MODEL REFERENCE POINTS

MORPHING METHOD FOR STRUCTURE SHAPE, ITS COMPUTER PROGRAM, AND COMPUTER-READABLE STORAGE MEDIUM

FIELD OF THE INVENTION

The present invention relates to the digital engineering field using CAD/CAE software.

BACKGROUND OF THE INVENTION

Conventionally, in the field of image processes using computers, a so-called morphing technique that deforms the shape of an object expressed by an original image into another shape using a computer has been proposed.

In the conventional morphing process, when the operator sets corresponding regions on a plurality of different images (mainly, images based on actually taken digital image information), a computer executes an in between interpolation process on the basis of information of the set individual regions. The in between interpolation process generates intermediate values so that various kinds of information such as the position, shape, color, and the like of an object present in the set region smoothly change among the plurality of pieces of image information. When the computer reproduces and displays an image on the basis of the plurality of pieces of image information, the intermediate values are referred to, thus implementing movement of pixels, which form the display screen, a change in display color of pixels, and the like. In this manner, upon reproducing and displaying an image using a plurality of pieces of actually taken digital image information in which parameters that can be used in shape deformation are not available, a continuous change in shape of the object to be deformed can be realized.

In recent years, as an example of such morphing technique, Japanese Patent Laid-Open No. 9-106453 has proposed the following technique. That is, when the operator interactively designates, in a computer, a deformation range on a source image to be deformed, which is segmented into a plurality of blocks in a grid pattern, grid points within that deformation range move according to predetermined movement rules, and at least some of the plurality of blocks deform, thus deforming the shape of an object expressed by the source image.

According to the above prior arts, the operator can easily issue a deformation instruction of an object expressed by a source image. However, since the conventional morphing technique is based on an image expressed by actually taken digital image data, the prior art has explained a deformation process of a two-dimensional (2D) shape expressed on a 2D coordinate system (X-Y), but does not contain any description about applications to a three-dimensional (3D) shape.

On the other hand, deformation of an animation image created using so-called computer graphics (CG) can be implemented more easily, than morphing based on actually taken digital image data, by continuously changing upon display parameters which are originally contained in a data structure which form that image information.

By contrast, 3D shape information such as a solid model, surface model, or the like generated in the design job in a vehicle manufacturer or the like using versatile software for CAD (Computer aided Design)/CAE (Computer aided Engineering) is a complicated data structure that contains a huge number of coordinate values, various kinds of attribute information, and the like, and such data structure largely varies depending on suppliers (software vendors). Hence, no aforementioned attempts have been made to generate and display a deformed shape on the basis of a source shape of an object.

However, in the design jobs in vehicle manufacturers and the like, CAE software programs that simulate analysis of 3D shape information of a structure generated using CAD software by a computer have prevailed, and among such programs, an analysis method based on a finite element method (FEM) has become widespread.

In the analysis method based on the FEM, the user must execute prearrangement processes, i.e., must segment a structure to be analyzed, which is expressed by 3D shape information, into a mesh pattern using a pre-processor, and must set attribute information such as constraint conditions, boundary conditions of predetermined items such as stress and the like, and so forth. Such prearrangement processes largely influence the precision and processing time of an analysis process, which is actually done using a solver for FEM. Hence, optimal setups which must be made prior to the analysis process impose heavy work loads on the user of the design department, who must develop a new model vehicle within a short period of time by effectively utilizing a limited development period.

However, in such development circumstance, a new model vehicle to be developed by the design department is often a derived vehicle based on existing vehicles. In this case, since data groups (data sets: corresponding to FEM models in an embodiment to be described later) prepared in the prearrangement processes of the analysis process using the solver upon developing such existing vehicles have already been stored in a database in an enterprise, such data groups should be effectively utilized as resources upon developing a new model vehicle such as a derived vehicle or the like.

SUMMARY OF THE INVENTION

The present invention has been made to solve the conventional problems, and has as its object to provide a morphing method of a structure shape, which can quickly and easily acquire the FEM model of a structure to be analyzed using that of a prototype structure, its computer program, and a computer-readable storage medium.

In order to achieve the above object, a morphing method of a structure shape according to the present invention is characterized by the following arrangement.

That is, there is provided a morphing method of a structure shape using a computer, comprising:

(i) a preparation step of:

(i-1) acquiring:

at least outer shape information of a structure to be analyzed (e.g., a body structure of a derived vehicle, which is derived from an existing vehicle), and a FEM model (e.g., FIG. 12), which is generated in advance using a pre-processor of an analysis solver on the basis of a finite element method (FEM), and includes a three-dimensional mesh model that represents an outer shape of a prototype structure (e.g., a body structure of an existing vehicle) and additional information (e.g., boundary conditions, constraint conditions, and attribute information indicating materials and the like) associated with the mesh model, and (i-2) setting a plurality of corresponding reference points on the outer shape information of the structure to be analyzed and the mesh model of the prototype structure; and (ii) a morphing step of calculating a FEM model (e.g., FIG. 23) of the structure to be analyzed by moving a plurality of nodes which form the mesh model of the prototype structure on the basis of correspondence between the plurality of reference points set on the mesh model of the prototype structure and the outer shape information of the structure to be analyzed, so as to change the mesh model to an outer shape of the structure to be analyzed, and merging the additional information and associated state thereof with respect to the deformed mesh model.

Note that the above object is also achieved by an information processing apparatus corresponding to the morphing method of a structure shape with the above arrangement.

Furthermore, the above object is achieved by a program code which implements the morphing method of a structure shape with the above arrangement and an information processing apparatus using a computer, and a computer-readable storage medium that stores the program code.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

An embodiment in which the present invention is applied to the body structure of an automobile as a representative vehicle will be described in detail hereinafter with reference to the accompanying drawings.

[System Arrangement]

Figure 1:
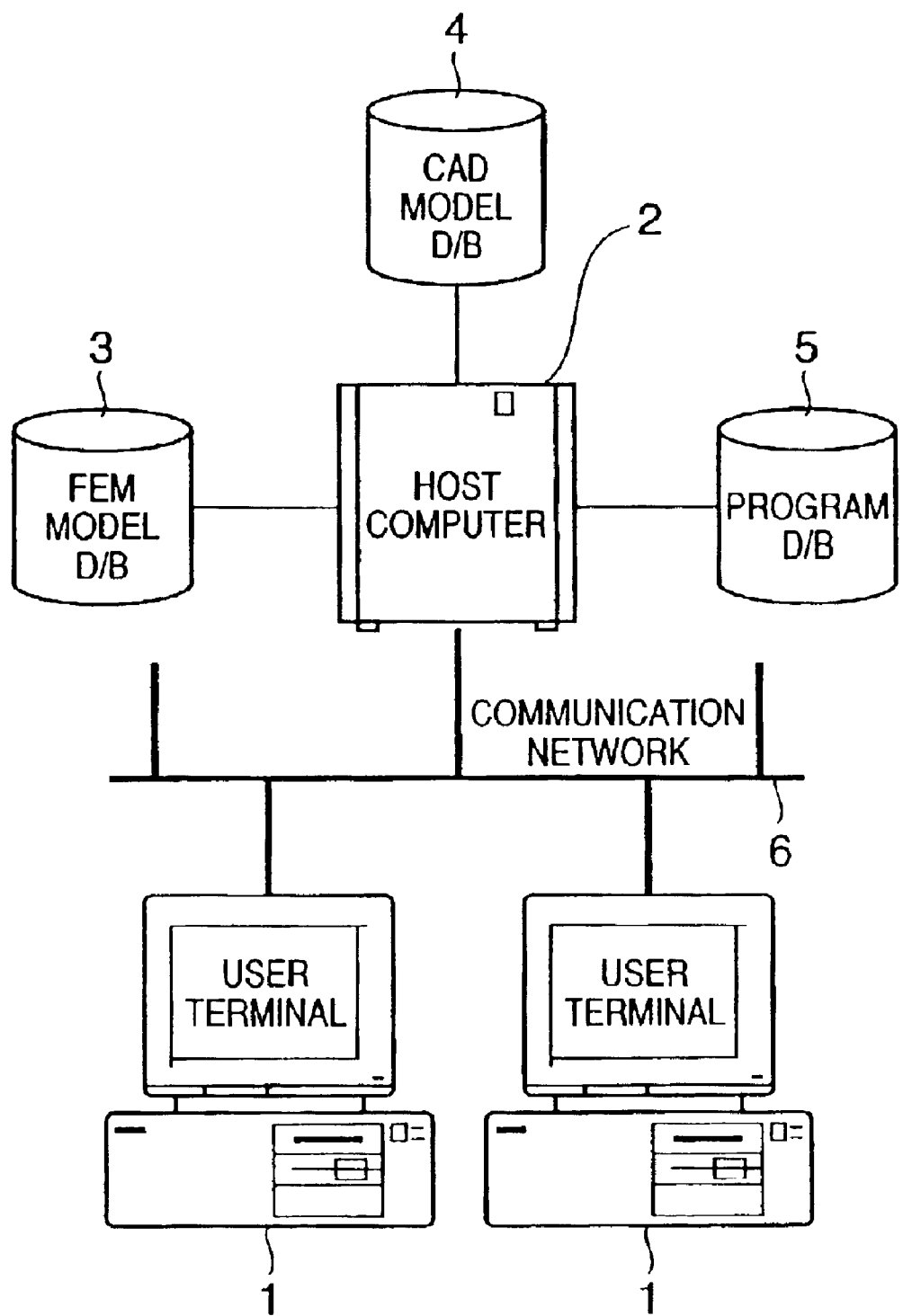
FIG. 1 is a diagram showing an example of the arrangement of a computer system which can be applied to an embodiment of the present invention.

FIG. 1 shows an example of the arrangement of a computer system which can be applied to this embodiment.

Referring to FIG. 1, a plurality of user terminals 1 and host computer 2 are connected via a communication network 6 to allow two-way communications among them, thus forming a general server-client environment. In this embodiment, since each user terminal 1, host computer 2, and communication network 6 can adopt general computers and network system, a description about their detailed apparatus arrangements will be omitted.

A FEM model database 3 stores FEM models of at least a plurality of types of existing vehicles prior to the beginning of the operation of a processing system to be described hereinafter in this embodiment, and can store a FEM model of a new model vehicle (including a derived vehicle derived from an existing vehicle: to be simply generally referred to as a "new model vehicle" hereinafter) generated by the functions of the processing system.

The FEM model of each individual existing vehicle is a data set (data file) that the person in charge of the design department of a vehicle manufacturer generated using a general pre-processor for FEM (finite element method) in the previous development/design jobs, and is stored while being newly associated with parameters and the like used to determine weighting coefficients by the function of a FEM model generation process of a new model vehicle to be described later in this embodiment.

A CAD model database 4 pre-stores 3D shape information such as a solid model, surface model, and the like of a new model vehicle that the person in charge of the design department of a vehicle manufacturer generated in the current development/design jobs using general CAD software.

A program database 5 stores software programs and the like, which implement the communication function with the user terminals 1, management programs of the aforementioned databases, and the function of the FEM model generation process of a new model vehicle according to this embodiment.

The host computer 2 is accessibly connected to the FEM model database 3, CAD model database 4, and program database 5, and serves as an application server computer upon login of each user terminal 1.

Note that the aforementioned system arrangement is one for a descriptive purpose, and the databases may be included in a single large-scale database or may be individually connected to the communication network 6. Also, in place of the server-client environment formed by the user terminals 1 and host computer 2, an environment formed by a single computer having a man-machine interface and databases may be used.

Figure 23:
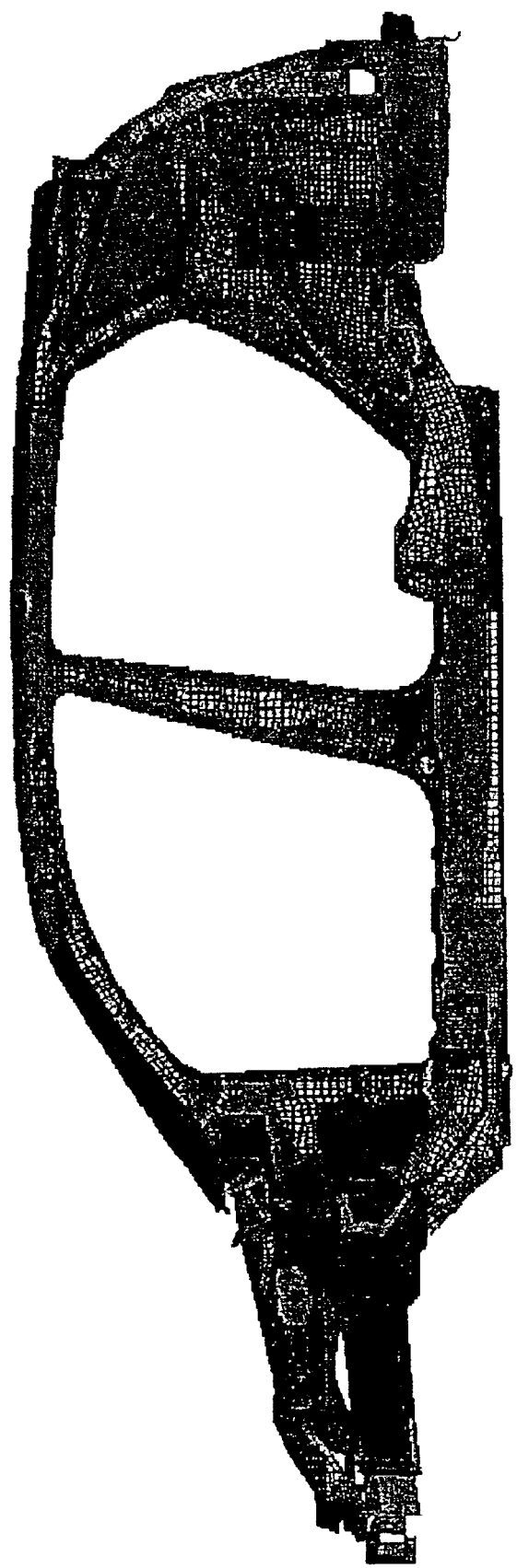
FIG. 23 shows an example of a FEM model of a new model vehicle calculated in the FEM model generation process of a new model vehicle according to the embodiment of the present invention.

The sequence for acquiring the FEM model (FIG. 23) of a body structure (structure to be analyzed) of a new model vehicle, which can be set in solvers for various analysis processes based on FEM, using the FEM model (FIG. 12) of a body structure (prototype structure) of an existing vehicle and the CAD model (FIG. 13) of the new model vehicle by the function of the FEM model generation function of a new model vehicle according to this embodiment will be explained below.

<FEM Model of Existing Vehicle>

Figure 12:
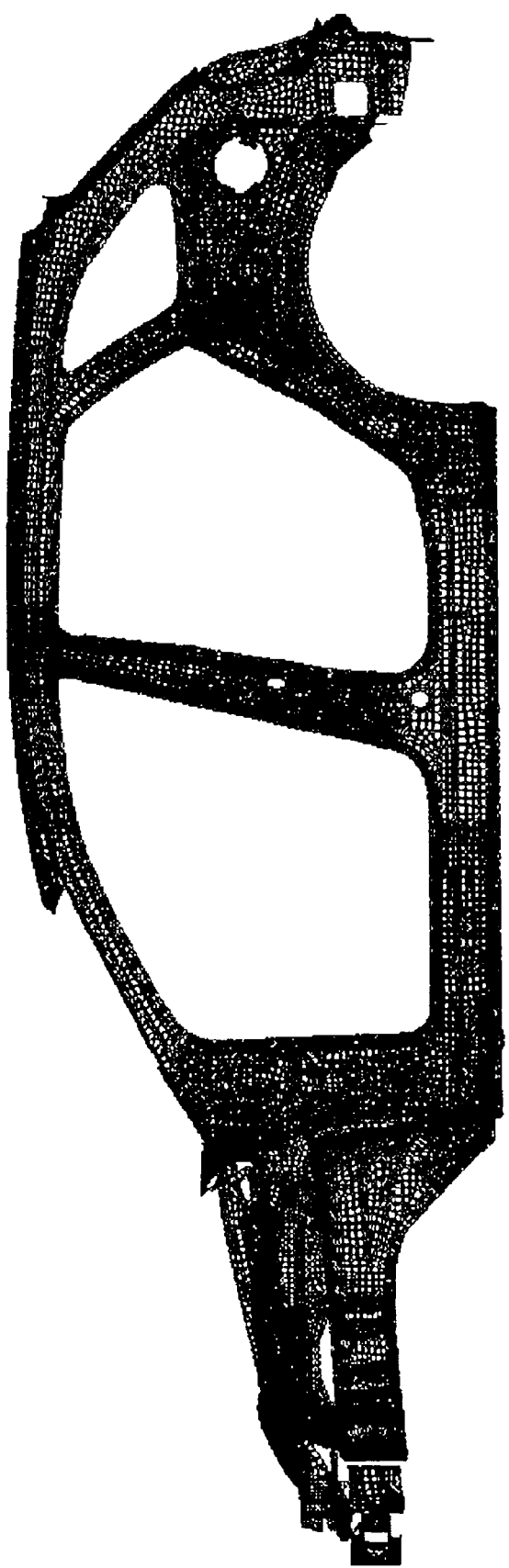
FIG. 12 shows an example of a FEM model of an existing vehicle in the embodiment of the present invention.

A FEM model will be explained first with reference to FIG. 12. FIG. 12 shows an example of the FEM model of an existing vehicle in this embodiment.

In this embodiment, the FEM model is a general data group (data set), which is ready to undergo analysis by solvers for FEM analysis processes such as mechanical strength analysis, thermal analysis, mechanism analysis, vibration analysis, and the like, and is pre-stored in the FEM model database 3.

The data set of the FEM model (to be simply referred to as the "FEM model" hereinafter) contains a mesh shape as 3D vehicle shape information, and this information is defined (associated) with predetermined additional information such as boundary conditions, constraint conditions, attribute information of materials, and the like.

The vehicle shape information contains a mesh model formed by a plurality of 3D (e.g., tetrahedral or hexahedral) solid elements (solid meshes) like the FEM model of the prototype (existing vehicle) exemplified in FIG. 12, and the roughness of each mesh (mesh size) varies depending on portions of the vehicle shape.

In the FEM model, the geometrical precision of the vehicle shape is determined by the coordinate values of a plurality of nodes which form that vehicle shape in the 3D coordinate space. Note that the node is a grid point which corresponds to the vertex of each individual solid mesh that forms the mesh shape (vehicle shape) of the FEM model.

<CAD Model of New Model Vehicle>

Figure 13:
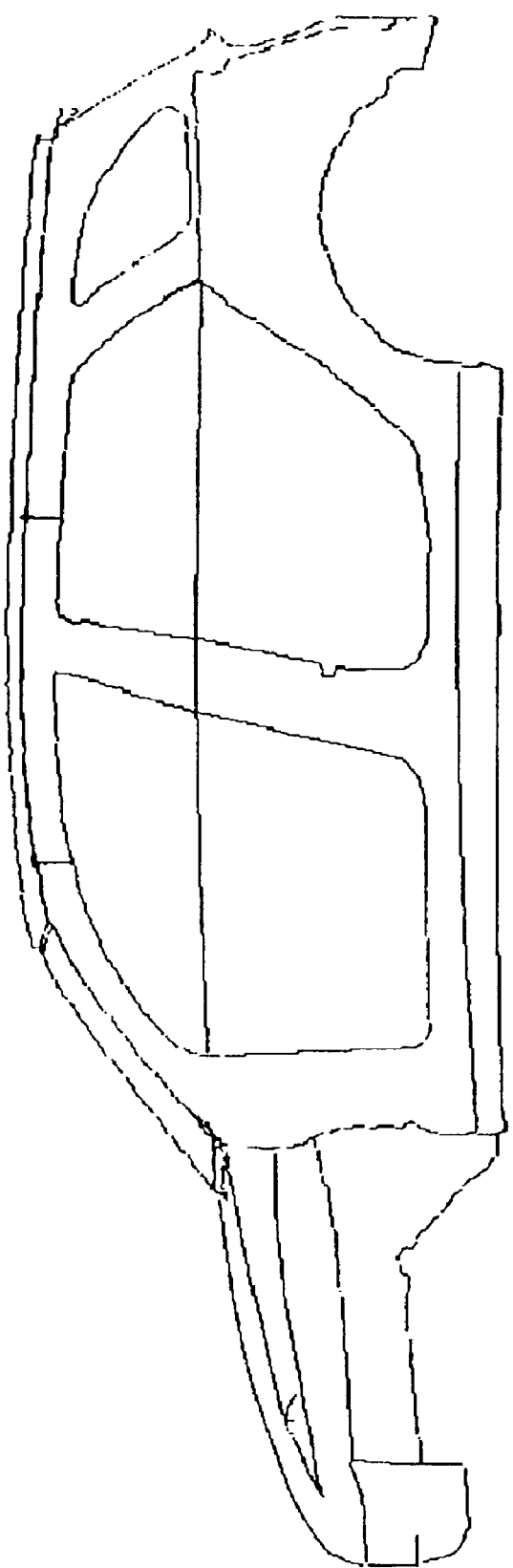
FIG. 13 shows an example of a CAD model of a new model vehicle in the embodiment of the present invention.

FIG. 13 shows an example of the CAD model of a new model vehicle in this embodiment.

In this embodiment, the CAD model of a new model vehicle is pre-stored in the CAD model database 4, and various 3D card models such as a solid model, surface model, and the like can be used as long as they contain at least 3D outer shape information of that new model vehicle.

[FEM Model Generation Process]

The FEM model generation process of a new model vehicle will be described in detail below.

Figure 2:
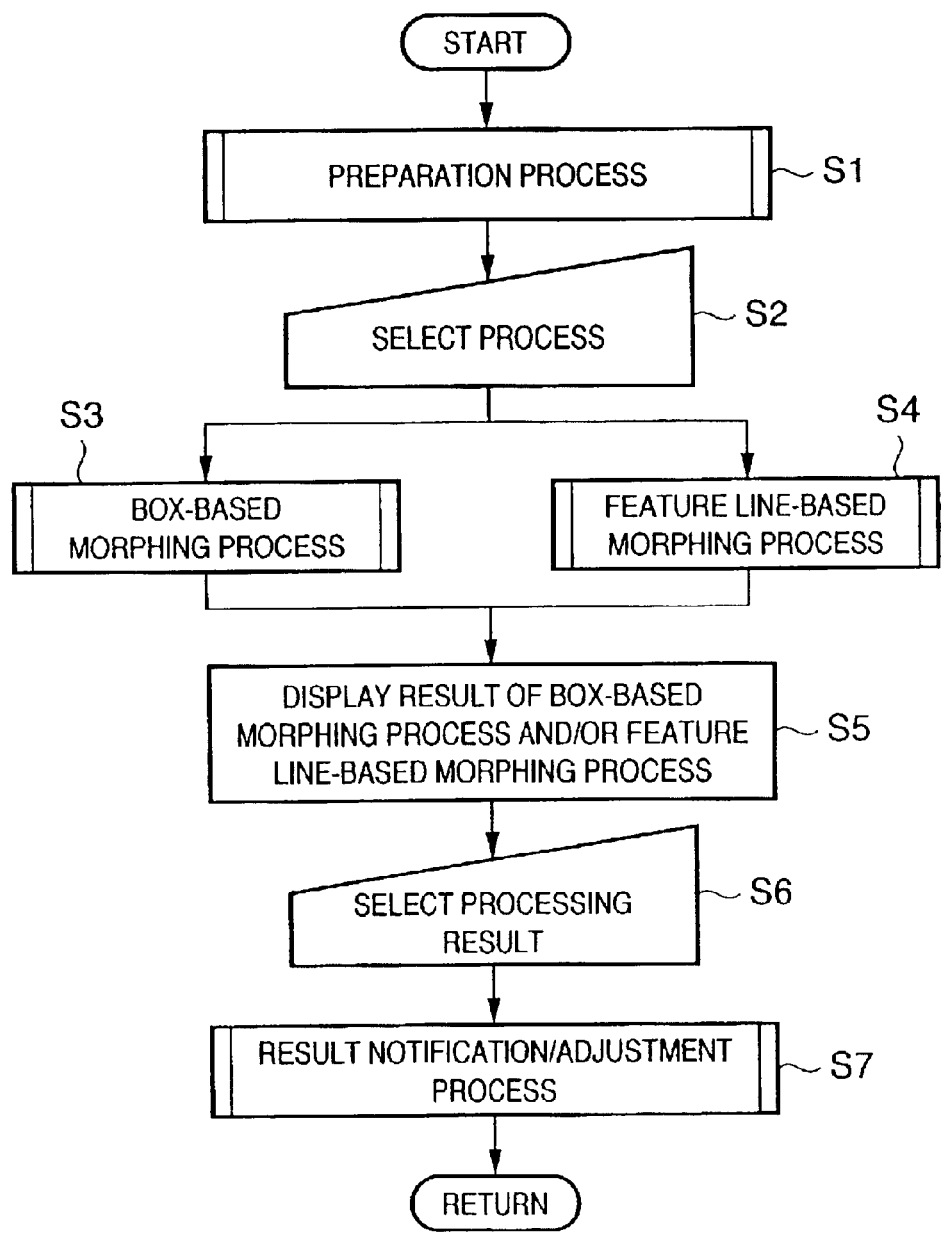
FIG. 2 is a flow chart showing an overview of a FEM model generation process of a new model vehicle according to the embodiment of the present invention.

FIG. 2 is a flow chart showing an overview of the FEM model generation process of a new model vehicle in this embodiment. This process shows the processing steps of a software program executed by the host computer 2 in accordance with user's input operations at the login user terminal 1.

Step S1 (FIG. 2): The user selects the FEM model of the existing vehicle used as a prototype, and the CAD model of a new model vehicle corresponding to the FEM model of the new model vehicle to be acquired by the FEM model generation process of a new model vehicle according to this embodiment. Also, predetermined constraint conditions and the like are set automatically or manually. Note that details of the preparation process of this step will be explained later with reference to the flow chart shown in FIG. 3.

Steps S2 to S4: A box-based morphing process (step S3), feature line-based morphing process (step S4), or both of these two different morphing processes are executed in accordance with user's selection operation (step S2). Each individual morphing process calculates the FEM model of the new model vehicle, the CAD model of which has been selected in step S1.

Note that details of the box-based morphing process in step S3 will be explained later with reference to the flow chart shown in FIG. 4. Also, details of the feature line-based morphing process in step S4 will be explained later with reference to the flow chart shown in FIG. 5.

Step S5: The morphing processing result in step S3 or S4 is displayed on a display of the user terminal 1. In this step, if the two different morphing processes have been selected in step S2, the FEM models of the new model vehicle, which have been individually calculated by these two different morphing processes, are displayed on a single screen. In this case, since it is not easy for the user to identify the two displayed FEM models, portions having different shapes and various kinds of associated information having different values in the two FEM models are preferably emphasized using, e.g., different display colors upon display.

Figure 25:
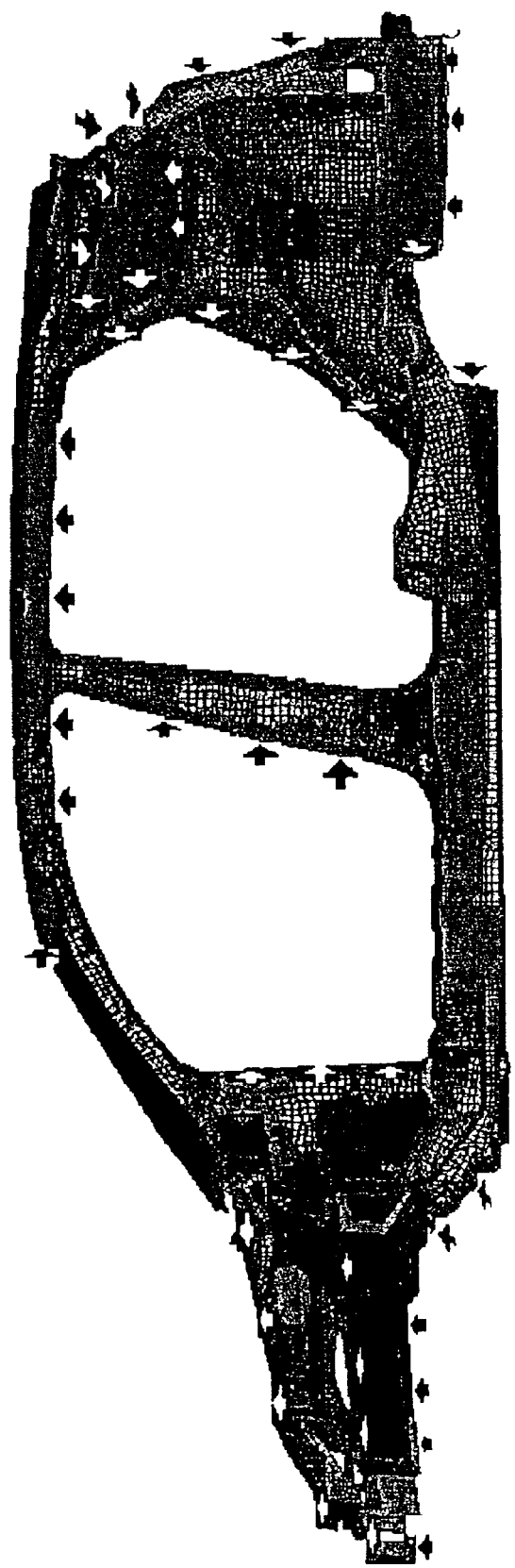
FIG. 25 exemplifies a case wherein the degrees of change in shape of the FEM model of the new model vehicle generated by the FEM model generation process of a new model vehicle according to the embodiment of the present invention from that of an existing vehicle as a prototype are indicated by arrows (vectors).

Also, as for the portions having different shapes between the FEM models of the existing vehicle and new model vehicle, when the shape of the new model vehicle is similar to that of the existing vehicle (e.g., when that new model vehicle is a derived vehicle of that existing vehicle), it is not easy for the user to identify them. Hence, in step S5, such portions are preferably indicated by arrows or the like that represent vectors allocated in the 3D coordinate space in accordance with the moving amounts and directions of corresponding nodes, which have been moved by the morphing process in step S3 or S4 (details will be explained later) in the mesh shapes (mesh models) of the two FEM models in accordance with user's selection operation, as exemplified in FIG. 25.

Step S6: If the two different morphing processes have been selected in step S2, the FEM model or models of the new model vehicle calculated by one or two morphing processes is or are selected in accordance with user's selection operation.

Step S7: If the two different FEM models have been selected in step S6, the mesh shapes and their additional information of these two FEM models are combined into one FEM model. Also, in this step, the adequacy of mesh quality of the mesh shape of one combined FEM model or of the FEM model selected in step S6, and the adequacy as a whole data set of such FEM model are checked, and the checking result is displayed for the user and is adjusted automatically or manually. Note that the result notification/adjustment process in step S7 will be described later with reference to the flow chart shown in FIG. 6.

<Preparation Process>

Figure 3:
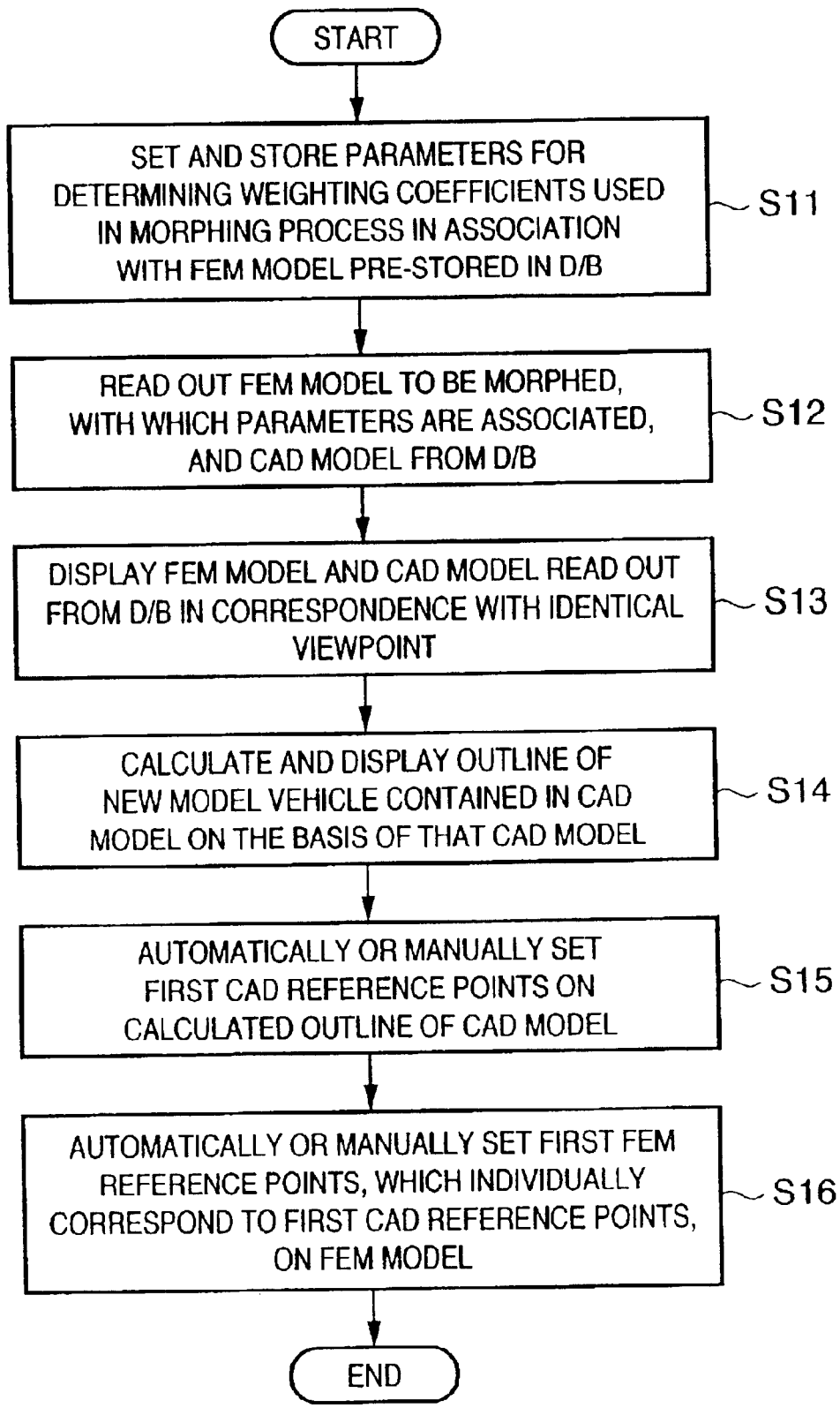
FIG. 3 is a flow chart showing details of a preparation process (step S1 in FIG. 2) of the FEM model generation process of a new model vehicle in the embodiment of the present invention.

FIG. 3 is a flow chart showing details of the preparation process (step S1 in FIG. 2) of the FEM model generation process of a new model vehicle in this embodiment.

Step S11 (FIG. 3): The user sets parameters used to determine weighting coefficients, which are used in the morphing process to be described later (FIG. 4 or 5) with respect to the FEM model of the existing vehicle as a prototype pre-stored in the FEM model database (D/B) 3 using setup windows shown in FIGS. 7A to 7C to FIGS. 9A and 9B. After the parameters are set, they are stored in association with the FEM model of the existing vehicle.

In this embodiment, each weighting coefficient is data determined by a parameter set by the user, and represents the degree of allowance or prohibition of a change in ridge line, grid, or the like of a part of user's choice by the morphing process.

Figure 7A:
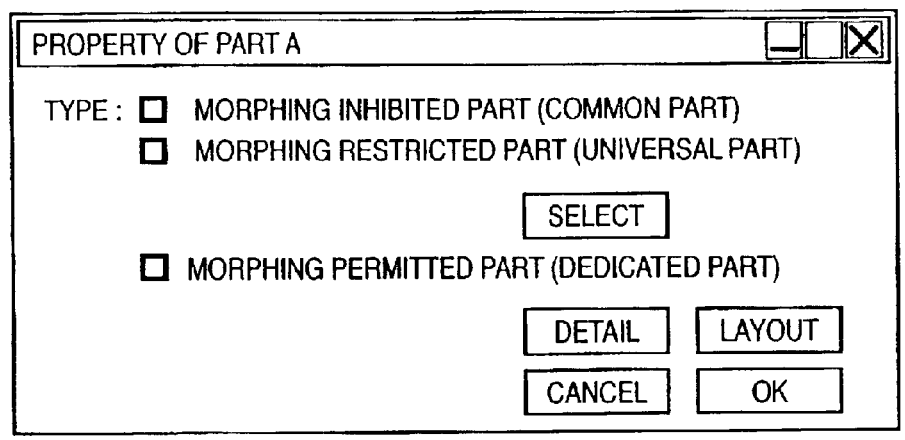
FIGS. 7A to 7C show an example of a setup window of parameters that the user can set for each desired part so as to determine weighting coefficients.
Figure 7B:
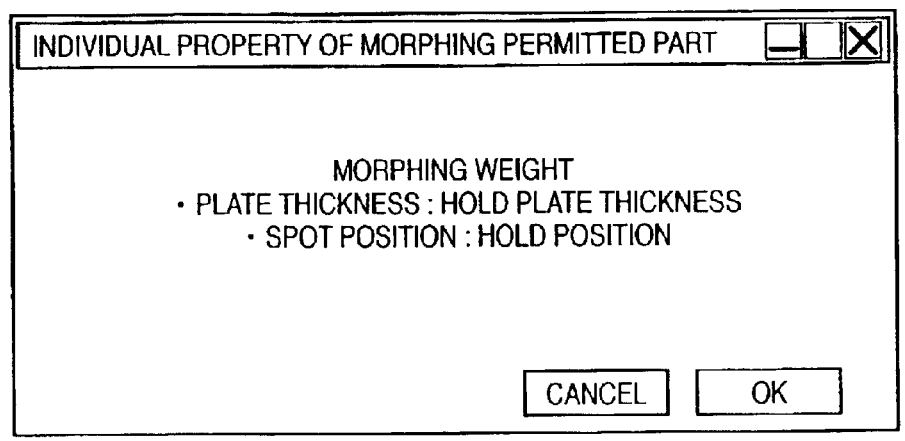
Figure 7C:
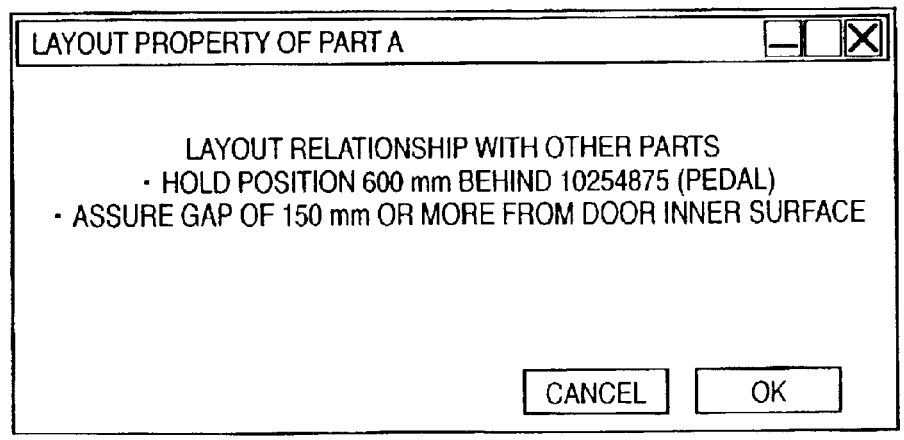

FIGS. 7A to 7C show an example of setup windows of parameters that the user can set for each desired part so as to determine weighting coefficients.

That is, if the user has selected a radio button "morphing inhibited part (common part)" or "morphing restricted part (universal part)" and has pressed an operation button "select" on the setup window shown in FIG. 7A, he or she can select a desired part, morphing of which is inhibited or restricted upon generating the FEM model of a new model vehicle on the basis of that of an existing vehicle displayed in a list (not shown). In this case, when the user sets such parameter, the host computer 2 automatically sets a weighting coefficient considerably smaller than other cases to be described below so as to inhibit or restrict morphing of the part of interest upon executing morphing.

If the user has selected a radio button "morphing permitted part (dedicated part)" and has pressed an operation button "details" on the setup window shown in FIG. 7A, a setup window shown in FIG. 7B is displayed. The setup window shown in FIG. 7B shows a state wherein the user sets to hold (restrain) the plate thickness and spot welding position before and after the morphing process as parameters used to determine weighting coefficients upon morphing. In this case, when the user sets such parameters, the host computer 2 automatically sets small weighting coefficients to inhibit the plate thickness and spot welding position of the part of interest from changing upon execution of morphing.

If the user has selected the radio button "morphing permitted part (dedicated part)" and has pressed an operation button "layout" on the setup window shown in FIG. 7A, a setup window shown in FIG. 7C is displayed. The setup window shown in FIG. 7C shows a state wherein the user sets to hold (restrain) the layout relationship between the dedicated part and other parts by concrete numerical values as parameters used to determine weighting coefficients upon morphing. In this case, when the user sets such parameters, the host computer 2 automatically sets small weighting coefficients to inhibit the distance and gap length between the part of interest and other parts from changing upon execution of morphing.

FIGS. 8A to 8C and FIGS. 9A and 9B show an example of setup windows of parameters that the user can set for the entire FEM model of the existing vehicle in place of each individual part, so as to determine weighting coefficients.

Figure 8A:
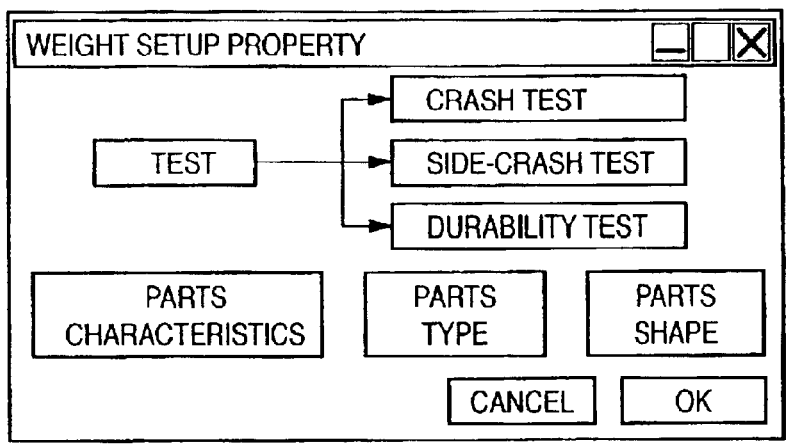
FIGS. 8A to 8C show an example of a setup window of parameters that the user can set for the entire FEM model of an existing vehicle so as to determine weighting coefficients.
Figure 8B:
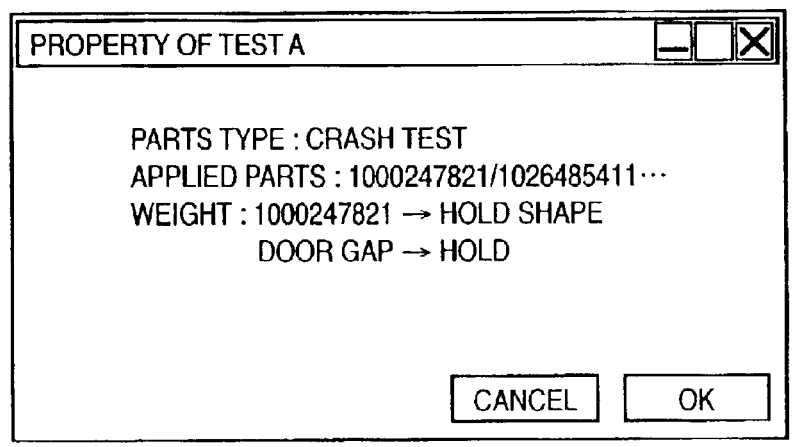

If the user has selected an operation button "crash test" on the setup window shown in FIG. 8A, a setup window shown in FIG. 8B is displayed. The setup window shown in FIG. 8B shows a state wherein the user selects applied parts in the crash test, and sets to hold (restrain) the shape and door gap of the selected parts as parameters used to determine weighting coefficients upon morphing. In this case, when the user sets such parameters, the host computer 2 automatically sets small weighting coefficients for the entire FEM model to prevent the text result from worsening by morphing.

Likewise, if the user has selected an operation button "side-crash test" or "durability test" on the setup window shown in FIG. 8A, the user can set parameters used to determine weighting coefficients upon morphing for his or her desired parts using setup windows (not shown) in accordance with his or her operations. In this case as well, when the user sets such parameters, the host computer 2 automatically sets small weighting coefficients for the entire FEM model to prevent the text result from worsening by morphing.

Figure 8C:
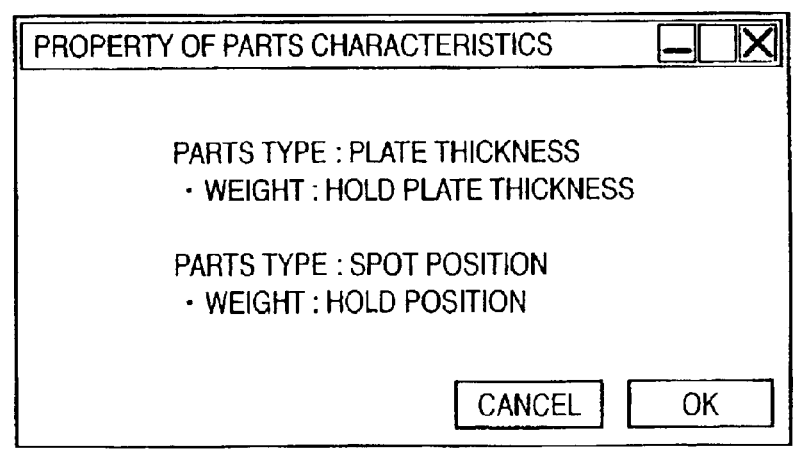

If the user has selected an operation button "part characteristics" on the setup window shown in FIG. 8A, a setup window shown in FIG. 8C is displayed. The setup window shown in FIG. 8C shows a state wherein the user sets to hold (restrain) the plate thickness and spot welding position before and after the morphing process as parameters used to determine weighting coefficients upon morphing. In this case, when the user sets such parameters, the host computer 2 automatically sets small weighting coefficients for the entire FEM model to inhibit the plate thickness and spot welding position of the part of interest from changing upon execution of morphing.

Figure 9A:
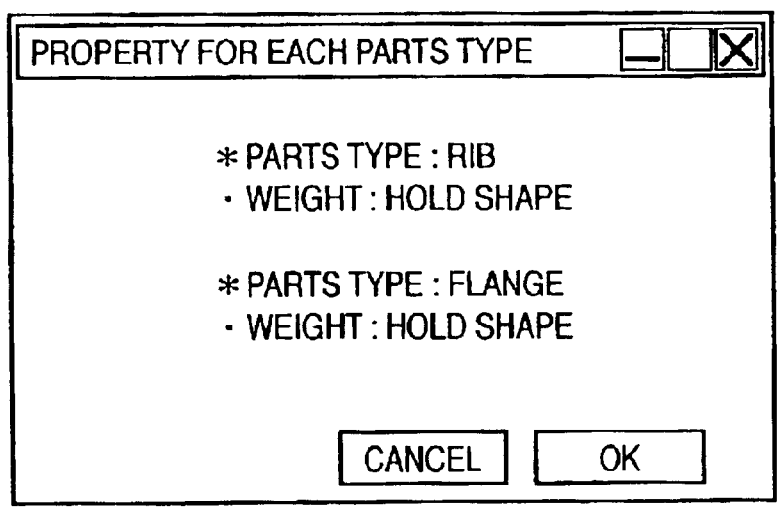
FIGS. 9A and 9B show an example of a setup window of parameters that the user can set for the entire FEM model of an existing vehicle so as to determine weighting coefficients.

If the user has selected an operation button "part type" on the setup window shown in FIG. 8A, a setup window shown in FIG. 9A is displayed. The setup window shown in FIG. 9A shows a state wherein the user sets to hold (restrain) the shapes of parts which are categorized to types "rib" and "flange" before and after the morphing process as parameters used to determine weighting coefficients upon morphing. In this case, when the user sets such parameters, the host computer 2 automatically sets small weighting coefficients to inhibit the parts which belong to the part types of interest from deforming upon execution of morphing.

Figure 9B:
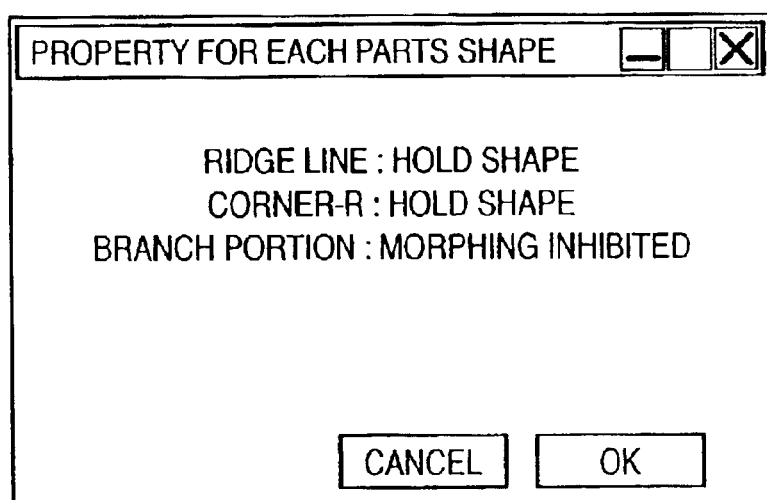

If the user has selected an operation button "part shape" on the setup window shown in FIG. 8A, a setup window shown in FIG. 9B is displayed. The setup window shown in FIG. 9B shows a state wherein the user sets to hold (restrain) the radii (R) of ridge lines and corner portion and the shapes of branched portions on which the stress is concentrated before and after the morphing process as parameters used to determine weighting coefficients upon morphing. In this case, when the user sets such parameters, the host computer 2 automatically sets small weighting coefficients to inhibit the parts having the corresponding part shapes from deforming upon execution of morphing.

Note that the setup windows shown in FIGS. 8A to 8C and FIGS. 9A and 9B are merely examples. In addition to these setups, various setups such as a setup for holding (restraining) a constant weight, outline, or the like before and after the morphing process, a setup for allowing a change in plate thickness in accordance with the size of a part generated by the morphing process, and the like for each individual part or the entire FEM model are available.

Step S12: The FEM model to be morphed (existing vehicle as a prototype), which is stored in the FEM model D/B 3 in association with the parameters, is read out in accordance with user's operation, and the CAD model of the new model vehicle stored in the CAD model D/B 4 is read out.

Step S13: The FEM model (FIG. 12) of the existing vehicle and the CAD model (FIG. 13) of the new model vehicle, which are read out in step S12, are displayed on the display of the user terminal 1 in correspondence with a given viewpoint (first viewpoint).

Step S14: The outline which forms the outer shape of the new model vehicle is calculated by a general method on the basis of data which form the CAD model of the new model vehicle, which is read out in step S12, and the calculated outline is displayed on the display of the user terminal 1.

Steps S15 and S16: A plurality of first CAD reference points are automatically or manually set on the calculated outline of the CAD model (step S15), and first FEM reference points which correspond to the first CAD points are automatically or manually set on the FEM model of the existing vehicle read out in step S12 (step S16).

Figure 14:
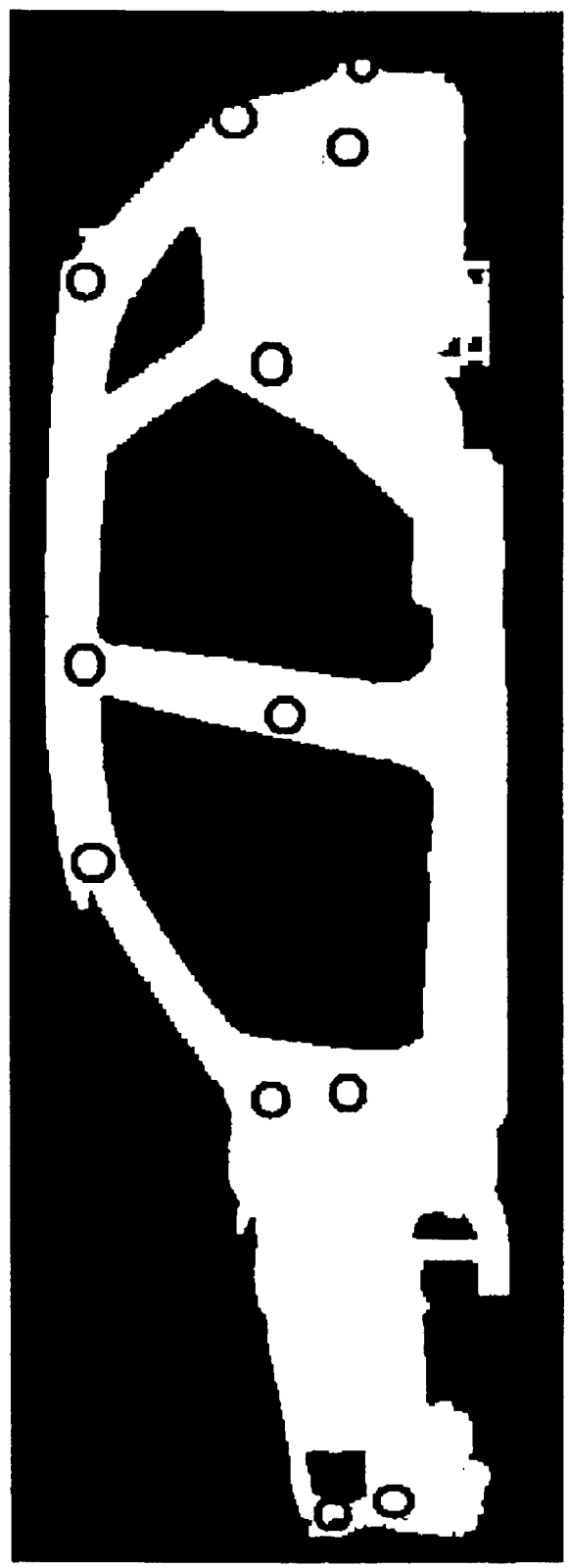
FIG. 14 shows an example of a mesh pattern of the FEM model of the existing vehicle after a plurality of first FEM reference points have been set.
Figure 15:
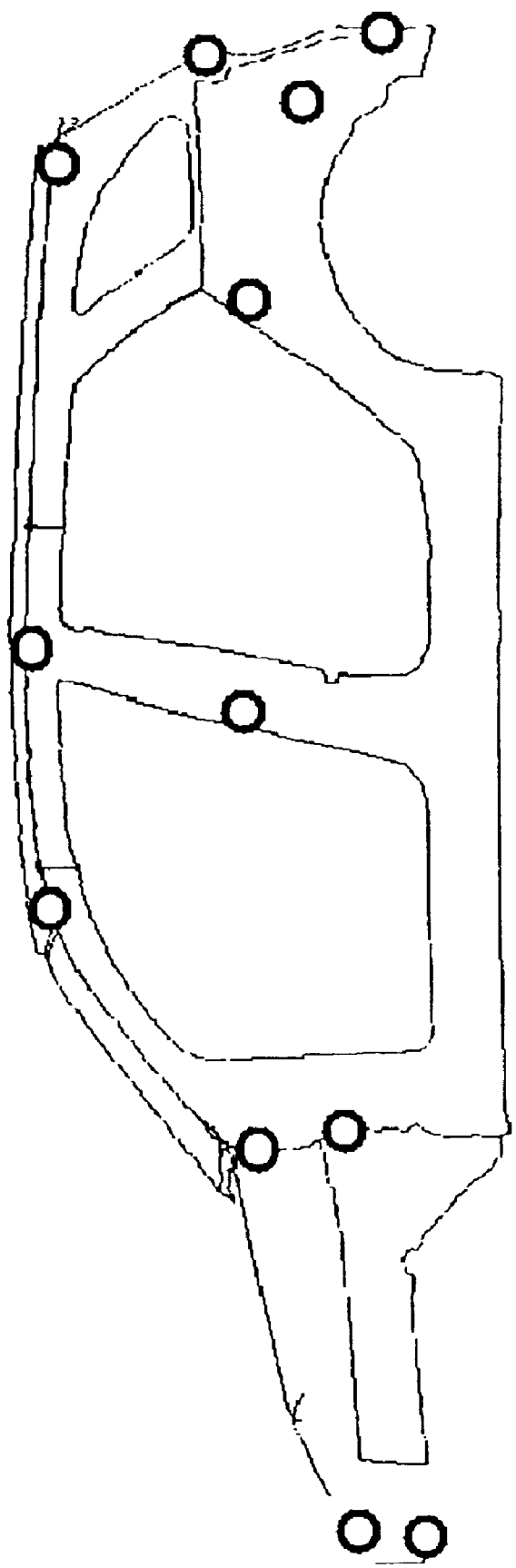
FIG. 15 shows an example of an outline of a new model vehicle after a plurality of first CAD reference points have been set.

Variations of a sequence for setting the first CAD reference points and first FEM reference points at corresponding positions, as shown in FIGS. 14 and 15, will be explained below.

More specifically, if the first CAD reference points and first FEM reference points are to be automatically set at corresponding positions in steps S15 and S16, a plurality of first CAD reference points may be automatically set at intersections of the outline which is calculated in step S14 and forms the outer shape of the new model vehicle, and first FEM reference points may be automatically set on a mesh model of the FEM model of the existing vehicle at positions corresponding to the set individual first CAD reference points. The intersections of the outline may be automatically set by a general image process.

In the above case, the first FEM reference points on the FEM model side, which correspond to the first CAD reference points on the CAD model side, may be set by exploiting parts names, shape information, and the like, which are set in advance in the CAD model of the new model vehicle and the FEM model of the existing vehicle. More specifically, when a first CAD reference point is set on the intersection between a B-pillar between the front and rear doors of the new model vehicle, and a line that connects the lower sides of windows of these doors, the intersection which corresponds to that first CAD reference point and is present between a B-pillar between the front and rear doors of the existing vehicle, and line connecting the lower sides of windows of these doors, is detected using the parts names, shape information, and the like, which are set in advance in the FEM model of the existing vehicle, and a first FEM reference point can be automatically set on the detected intersection. In this case, since the plurality of first CAD reference points and first FEM reference points as a reference upon morphing are automatically set, user's convenience can be improved.

Or when the user himself or herself manually sets first CAD reference points on the outline of the CAD model, first FEM reference points may be automatically set by detecting corresponding positions on the mesh shape of the FEM model of the existing vehicle by exploiting the parts names and the like, which are set in advance in the CAD model of the new model vehicle and the FEM model of the existing vehicle, in steps S15 and S16.

Or contrary to the above case, when the user himself or herself manually sets first FEM reference points on the mesh shape of the FEM model of the existing vehicle, the first CAD reference points may be automatically set detecting corresponding positions by exploiting the parts names and the like, which are set in advance in the CAD model of the new model vehicle and the FEM model of the existing vehicle, in steps S15 and S16.

FIG. 14 shows an example of the mesh shape of the FEM model of the existing vehicle after the plurality of first FEM reference points have been set. FIG. 15 shows an example of the outline of the new model vehicle after the plurality of first reference points have been set.

Individual "reference points" set, as shown in FIGS. 14 and 15, are points, their correspondence of which is always guaranteed before and after execution of the morphing process to be described later, and are reference points that assure the deformation precision by morphing according to this embodiment. In other words, there is a precondition that the first FEM reference points set for pre-deformation (existing vehicle) must move to the first CAD reference points set for post-deformation (new model vehicle).

The box-based morphing process (FIG. 4) and feature line-based morphing process (FIG. 5) will be described in detail below.

<Box-Based Morphing Process>

Figure 4:
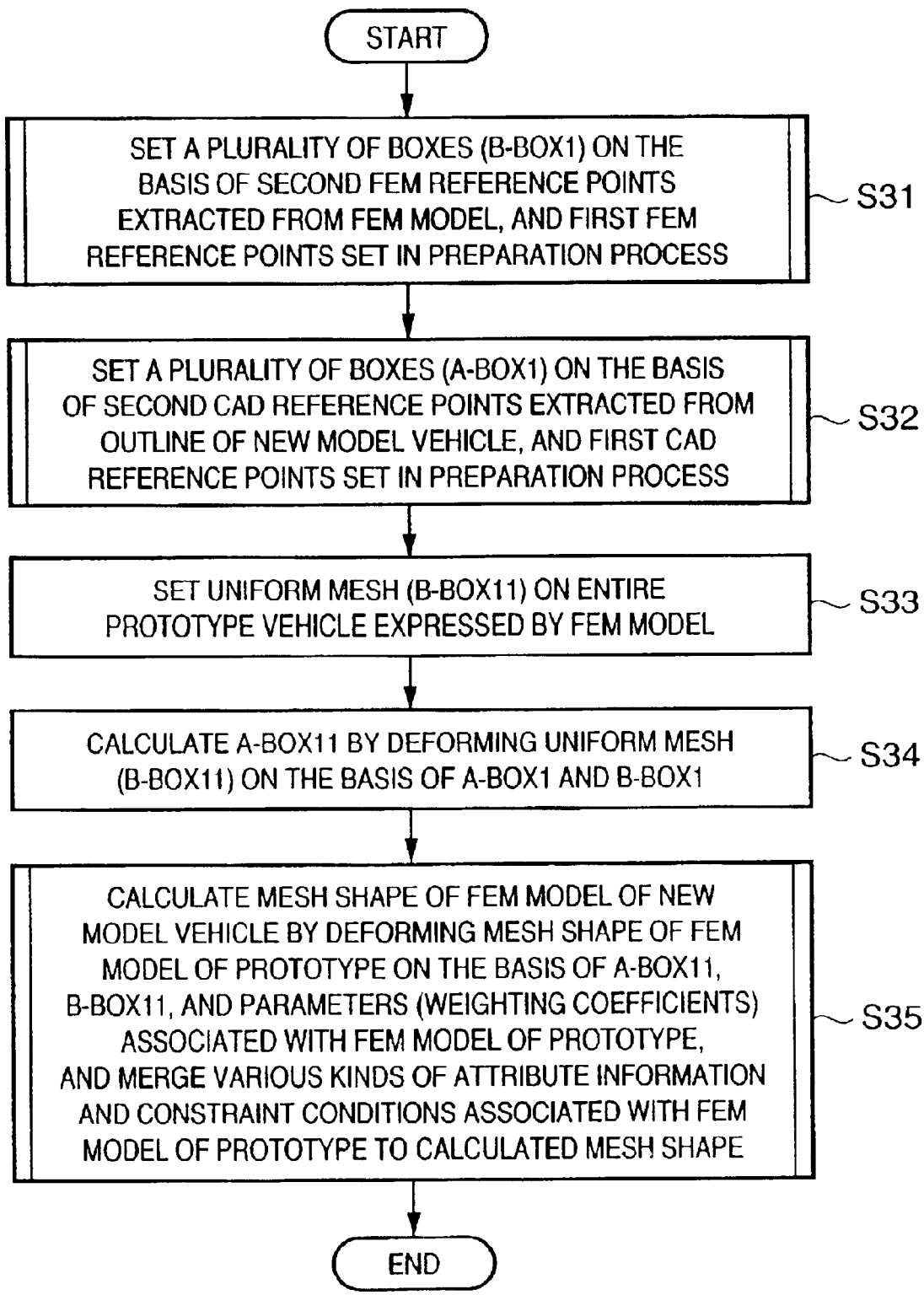
FIG. 4 is a flow chart showing details of a box-based morphing process (step S3 in FIG. 2) of the FEM model generation process of a new model vehicle in the embodiment of the present invention.

FIG. 4 is a flow chart showing details of the box-based morphing process (step S3 in FIG. 2) of the FEM model generation process of a new model vehicle in this embodiment.

Step S31 (FIG. 4): A plurality of second FEM reference points are extracted from the FEM model of the existing vehicle read out in step S12, and B-BOX1 which is formed by a plurality of hexahedrons (boxes) that represent the outer shape of the existing vehicle is generated on the basis of the extracted second FEM reference points, and the plurality of first FEM reference points set in the preparation process (FIG. 3).

Figure 16:
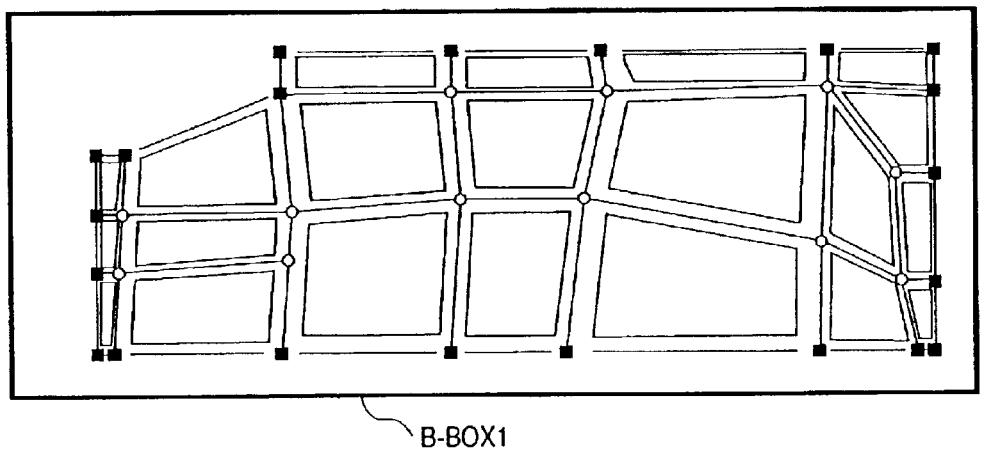
FIG. 16 shows B-BOX1 generated based on a plurality of first and second FEM reference points.

FIG. 16 shows B-BOX1 generated based on the plurality of first and second FEM reference points. In FIG. 16, ○ marks (open circles) respectively indicate the first FEM reference points, and ■ marks (full squares) respectively indicate the second FEM reference points.

Note that the individual second FEM reference points are automatically set on the outer plate of the existing vehicle (i.e., the outer shape of the existing vehicle) or within a region outside the existing vehicle from that outer plate, so that boxes formed by these second FEM reference points and the plurality of first FEM reference points include the existing vehicle.

Step S32: A-BOX1 which represents the outer shape of the new model vehicle and is formed by a plurality of hexahedrons (boxes) is generated on the basis of second CAD reference points extracted from the outline, which is calculated in step S14 and forms the outer shape of the new model vehicle, and the first CAD reference points set in the preparation process (FIG. 3).

Figure 17:
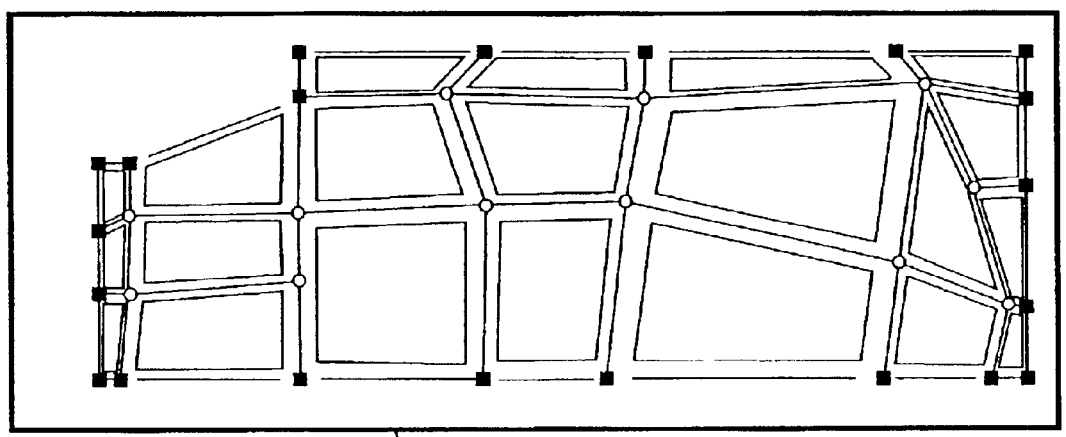
FIG. 17 shows A-BOX1 generated based on a plurality of first and second CAD reference points.

FIG. 17 shows A-BOX1 generated based on the plurality of first and second CAD reference points. In FIG. 17, ○ marks (open circles) respectively indicate the first CAD reference points, and ■ marks (full squares) respectively indicate the second CAD reference points.

Note that the individual second CAD reference points are automatically set on the outer plate of the new model vehicle (i.e., the outer shape of the new model vehicle) or within a region outside the new model vehicle from that outer plate, so that boxes formed by these second CAD reference points and the plurality of first CAD reference points include the new model vehicle.

In step S32, A-BOX1 may be set by moving the individual boxes, which form B-BOX1 including the first and second FEM reference points, in accordance with the first CAD reference points set in the preparation process, and second CAD reference points, which are extracted from the outline in this step.

Step S33: A uniform mesh (B-BOX11) is automatically set by a general method for the entire existing vehicle expressed by the FEM model, as shown in FIGS. 18 and 19.

Figure 18:
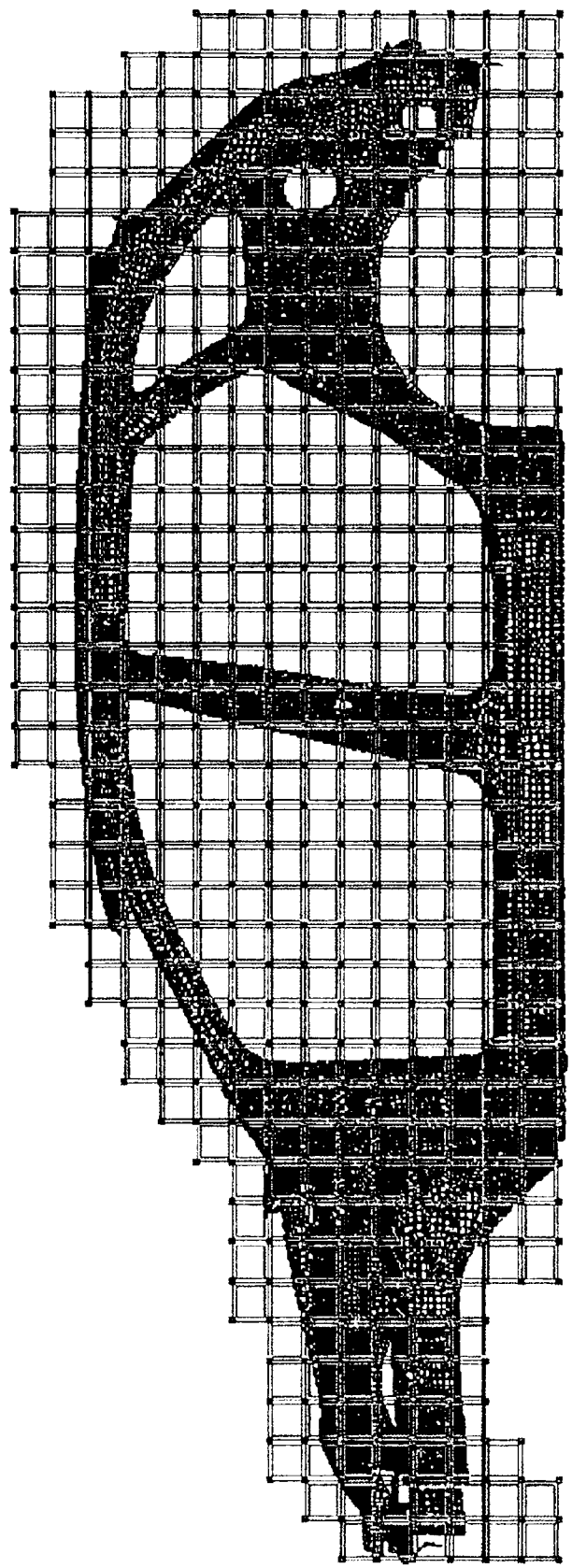
FIG. 18 shows a state wherein B-BOX11 in which respective meshes have the same mesh size is set for the FEM model of the existing vehicle shown in FIG. 12.
Figure 19:
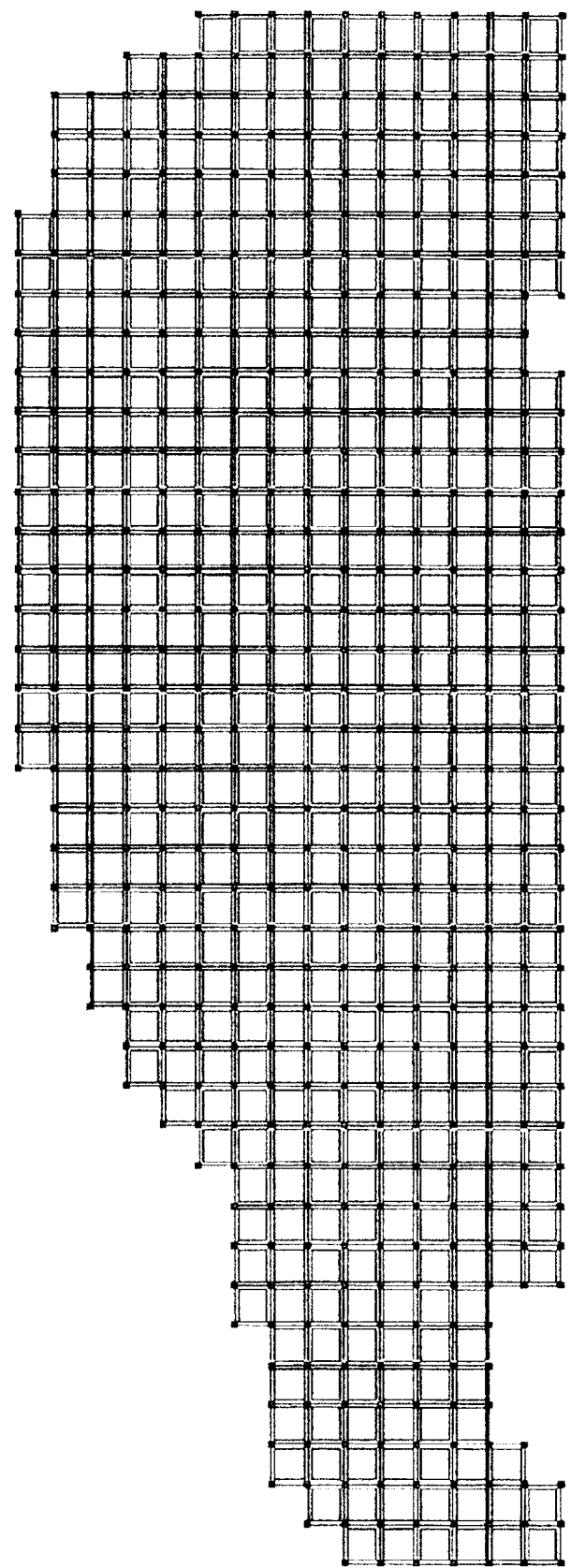
FIG. 19 shows B-BOX11 alone set in the embodiment of the present invention.

FIG. 18 shows a state wherein B-BOX11 in which individual meshes have the same mesh size is set for the FEM model of the existing vehicle shown in FIG. 12. FIG. 19 shows set B-BOX11 alone.

Step S34: B-BOX11 is deformed on the basis of B-BOX1 generated in step S31, and A-BOX1 generated in step S32, thereby calculating A-BOX11.

Figure 20:
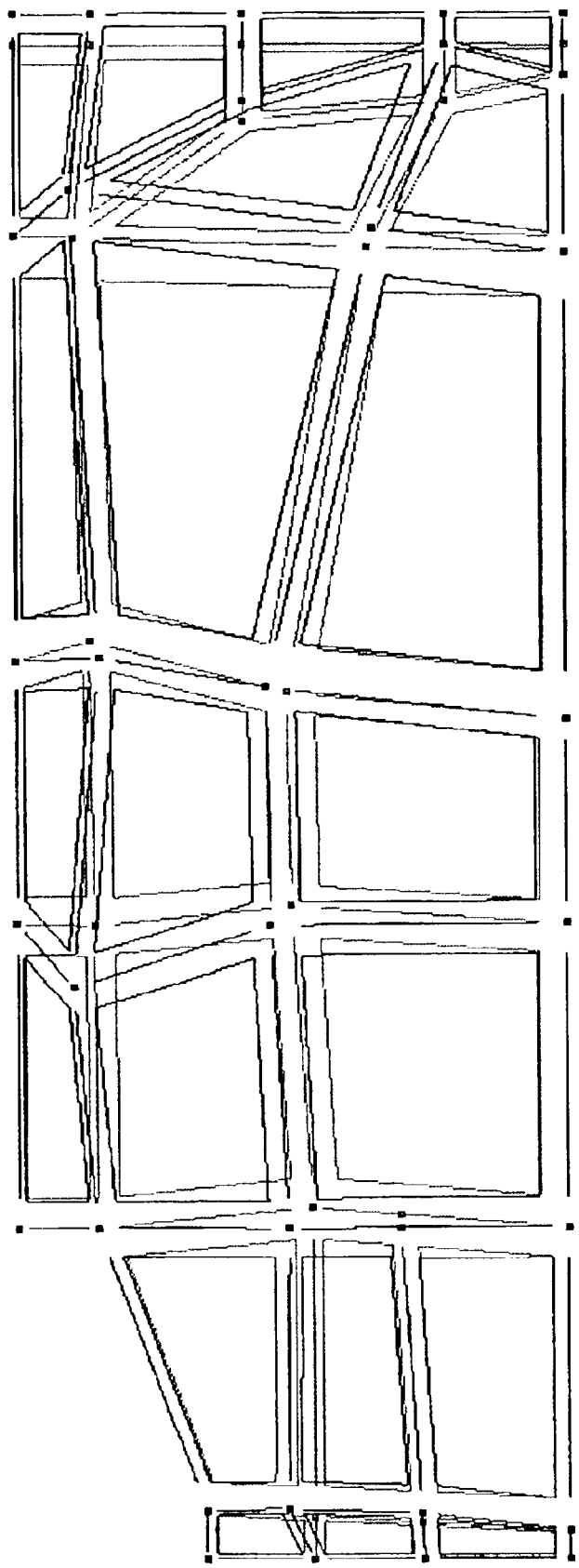
FIG. 20 shows an overlap state of A-BOX11 and B-BOX1.
Figure 21:
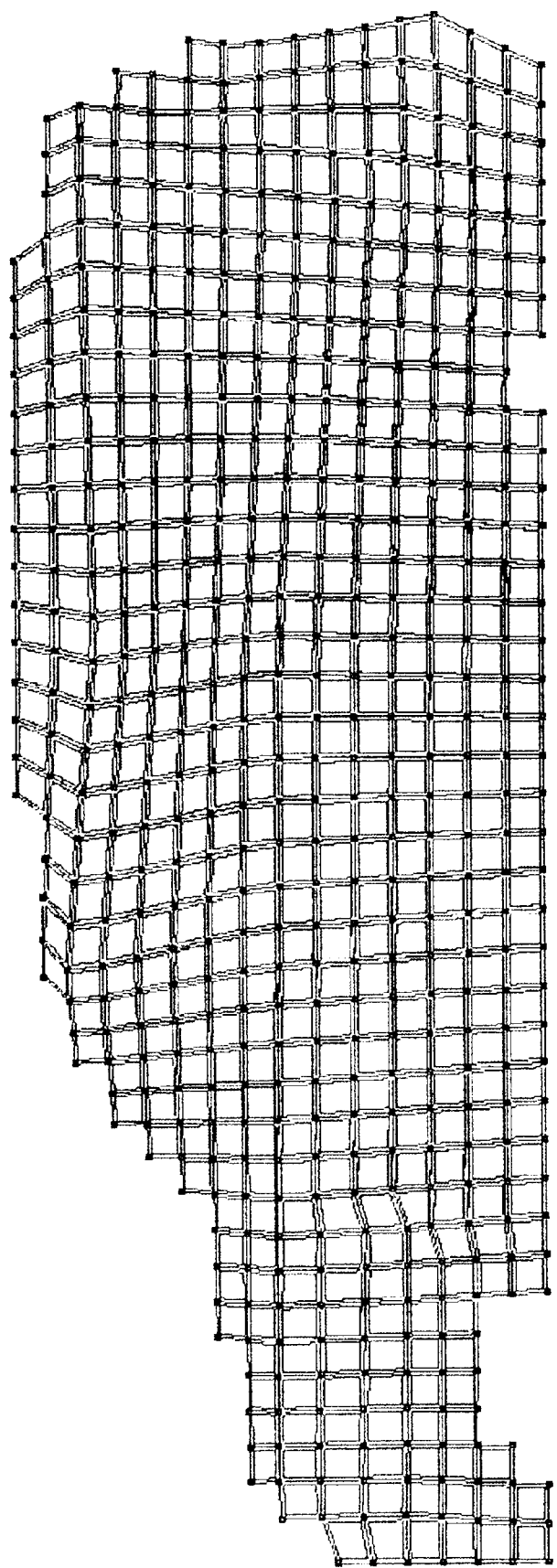
FIG. 21 shows A-BOX11 generated by deforming B-BOX11 on the basis of B-BOX1 and A-BOX1.

FIG. 20 shows an overlap state of A-BOX11 and B-BOX1. FIG. 21 shows A-BOX11 generated by deforming B-BOX11 on the basis of B-BOX1 and A-BOX1.

Since B-BOX1 and A-BOX1 include one each corresponding boxes, as shown in FIG. 20, a process for moving nodes included in a given box of B-BOX1 of a plurality of nodes which form the uniform mesh (B-BOX11) in accordance with the shape of a given box of A-BOX1 corresponding to that box is executed for all boxes in accordance with the difference between the shapes of the two corresponding boxes in step S34. In this way, A-BOX11 shown in FIG. 21 is calculated.

That is, the difference between the shapes of two corresponding boxes in B-BOX1 and A-BOX1 is expressed by the difference between the coordinate values of first and/or second FEM reference points which form a given box that constitutes B-BOX1, and the coordinate values of first and/or second CAD reference points, which correspond to these first and/or second FEM reference points, and form any one box that constitutes A-BOX1. Then, moving vectors (directions and sizes) from the first and second FEM reference points to the first and second CAD reference points, which respectively correspond to each other, are uniquely obtained.

Hence, in step S34 a plurality of nodes contained in a given box of B-BOX1 are moved in accordance with moving vectors which are specified by the first and second FEM reference points which form that box, and corresponding first and second CAD reference points. By executing this process for all boxes, A-BOX11 is calculated. The calculated A-BOX11 is a master mesh which represents a change in shape from the outer shape of the existing vehicle to that of the new model vehicle, and corresponds to a template that represents the difference between the outer shapes of the existing vehicle and new model vehicle.

Step S35: If the plurality of first and second FEM reference points include a reference point which deviates (offsets) from nodes that form B-BOX11, a node near this reference point is adjusted to be located on that reference point. Likewise, if the plurality of first and second CAD reference points include a reference point which deviates (offsets) from nodes that form A-BOX11, a node near this reference point is adjusted to be located on that reference point (if the deviation amount is large, a plurality of surrounding nodes are preferably moved as needed). Such adjustment of the node positions is preparation for implementing high-precision morphing, and is preferably executed especially when the user manually sets the first FEM reference points and/or first CAD reference points.

Further, in step S35, by deforming the mesh shape of the FEM model of the existing vehicle (prototype) on the basis of the weighting coefficients determined according to the parameters associated with the FEM model, and A-BOX11 and B-BOX11 that have undergone node position adjustment, the mesh model of a FEM model of the new model vehicle is calculated. In addition, in accordance with movement of nodes (i.e., a plurality of nodes which form a first mesh shape included in the FEM model of the existing vehicle) to the calculated mesh shape (i.e., a second mesh shape to be included in the FEM model of the new model vehicle), additional information which is associated with the FEM model of the existing vehicle and includes various kinds of attribute information, boundary conditions, constraint conditions, and the like, is re-defined (merged) with respect to a plurality of nodes that form the second mesh shape, thereby calculating a data set of the FEM model (FIG. 23) of the new model vehicle. The calculated FEM model of the new model vehicle is displayed on the display of the user terminal 1 in step S5, as described above.

Figure 22:
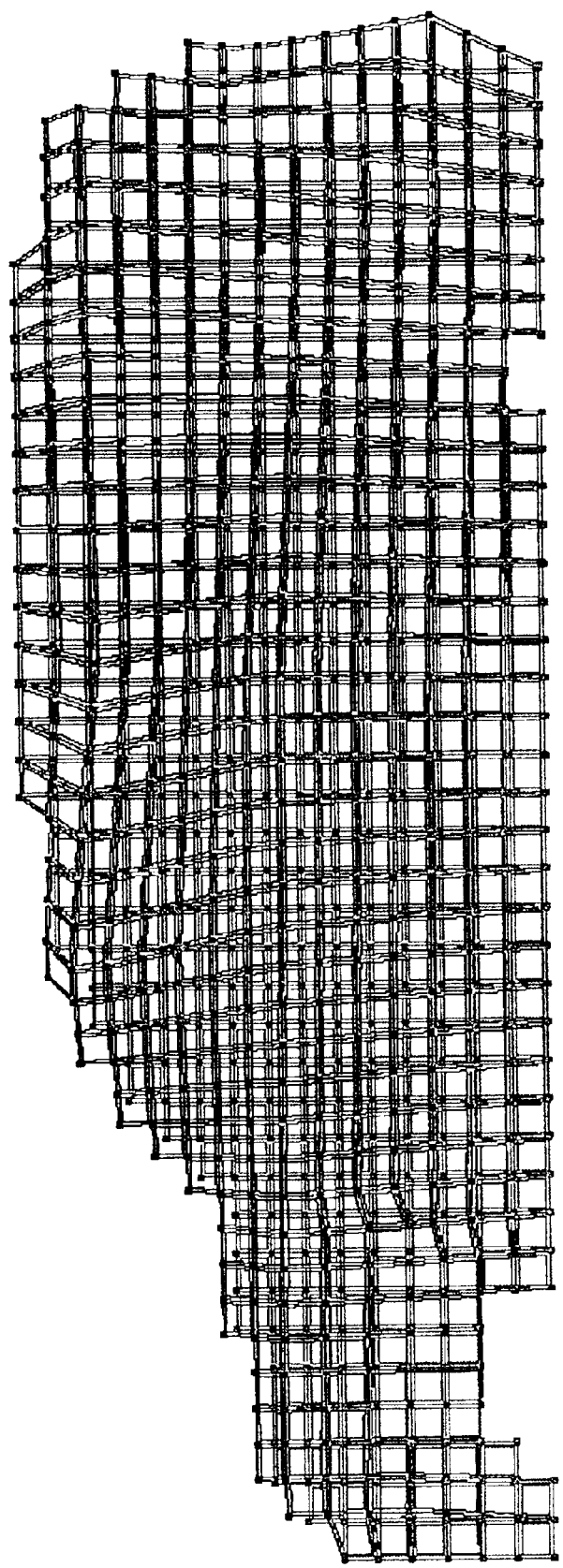
FIG. 22 shows an overlap state of A-BOX11 and B-BOX11, which have undergone node position adjustment.

FIG. 22 shows an overlap state of A-BOX11 and B-BOX11, which have undergone the node position adjustment. Basically, the mesh shape of a FEM model associated with the new model vehicle is generated from that of the FEM model associated with the existing vehicle in accordance with correspondence between these two mesh shapes. In this case, upon moving the coordinate position of each individual node, its moving amount is restricted by the aforementioned weighting coefficient.

Figure 10:
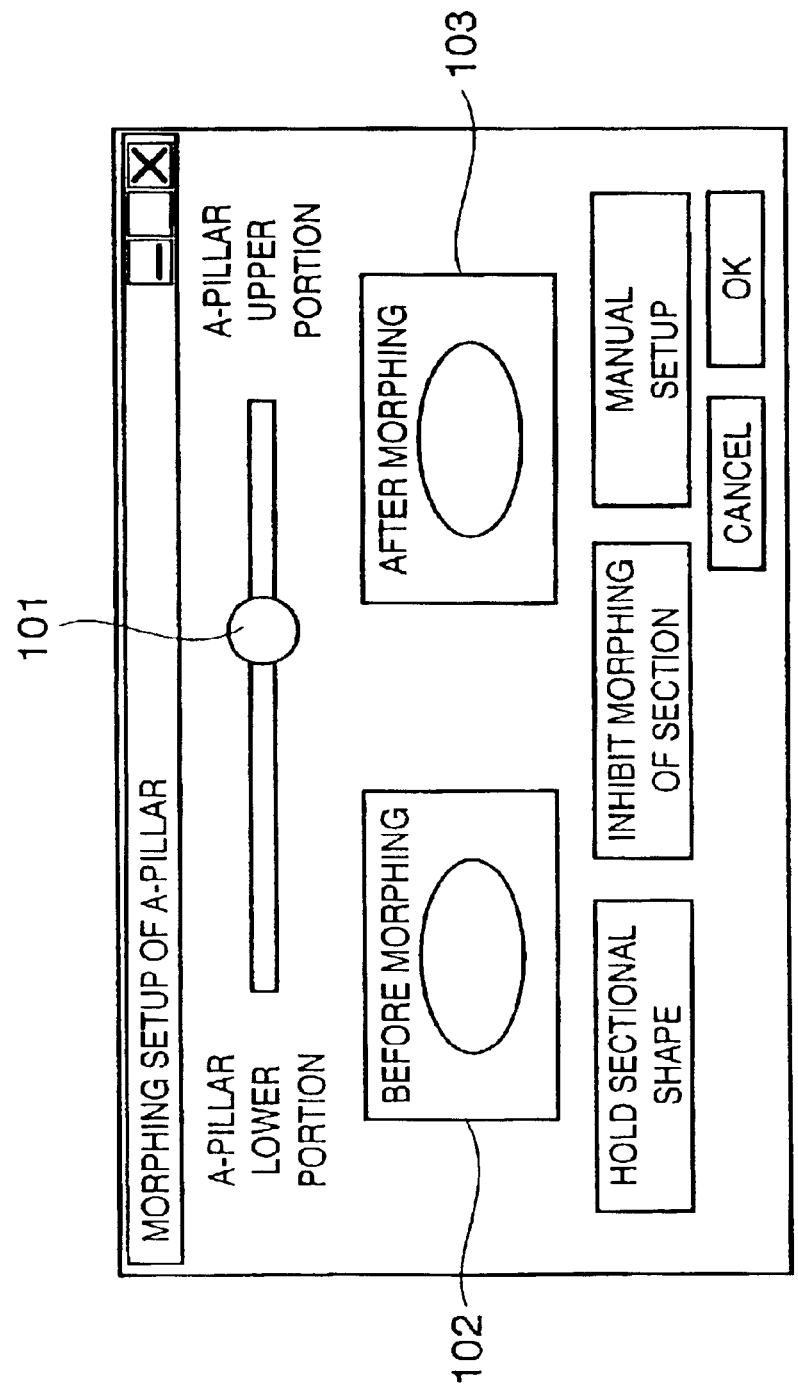
FIG. 10 shows a setup window on which the user makes a morphing setup of an A-pillar.

In step S35, a setup window shown in FIG. 10 is displayed on the display of the user terminal 1 prior to deformation of the mesh shape of the FEM model.

FIG. 10 shows the setup window on which the user makes a morphing setup of an A-pillar. This setup window is automatically displayed upon detection of the state (step) immediately before morphing according to this embodiment is executed. In a preferred embodiment, this setup window is displayed in response to, e.g., predetermined user's operation (e.g., selection using a mouse or the like) at the A-pillar portion of the FEM model of the existing model when the user wants to make a setup.

In step S13 in the aforementioned preparation process (FIG. 3), the FEM model (FIG. 12) of the existing vehicle and the CAD model (FIG. 13) of the new model vehicle are displayed on the display of the user terminal 1 in correspondence with a given viewpoint as the first viewpoint in a format that allows the user to visually recognize them, prior to the automatic or manual setups of the plurality of first CAD reference points and corresponding first FEM reference points. By contrast, on the setup window shown in FIG. 10, the user sets a new constraint condition to be referred to upon changing deformation of the mesh shape of the FEM model at a second viewpoint, which is different from the first viewpoint. At the second viewpoint, the user can easily recognize the sectional shape of a member (for example, an A-pillar in this embodiment) which extends in the longitudinal direction at the first viewpoint.

More specifically, when the user moves a software button 101 to the right or left using a pointing device such as a mouse or the like, the sectional shape of the A-pillar (except for an A-pillar upper portion connected to a roof, and a lower portion connected to an engine hood) before deformation is displayed on a region 102 in accordance with that movement, and the sectional shape after deformation is displayed on a region 103. When the user has moved the software button 101 to a desired position and has pressed an operation button "hold sectional shape" in that state, the sectional shape of the A-pillar after the morphing process is held to be the shape displayed on the region 103 when that selection was made, even when the slope of that A-pillar has changed in accordance with the CAD model of the new model vehicle.

When the user has selected an operation button "inhibit deformation of section", since deformation of the sectional shape of the A-pillar is inhibited, the sectional shape of the A-pillar contained in the FEM model (mesh model of that FEM model) of the existing vehicle is held (restrained) as that of the A-pillar contained in the FEM model (mesh model of that FEM model) of the new model vehicle, even when the slope of that A-pillar has changed in accordance with the CAD model of the new model vehicle.

When the user has selected an operation button "manual setup", he or she can set the sectional shape of the A-pillar in more detail using a setup window (not shown).

The parameter set at the second viewpoint using the setup window shown in FIG. 10 is a constraint condition, which is reflected in a range narrower than the application range of the plurality of first CAD reference points set at the first viewpoint and corresponding first FEM reference points. However, it is preferable that the parameter set at the second viewpoint is reflected in preference to these plurality of reference points in the morphing process. In this manner, an impractical deformed shape can be easily prevented from being calculated for even a portion of the new model vehicle, which is important in the body structure.

In the aforementioned box-based morphing process, since morphing that accurately reflects the shape difference is executed for respective corresponding boxes on the basis of B-BOX1 formed by a plurality of boxes (first hexahedrons) set for the existing vehicle and A-BOX1 formed by a plurality of boxes (second hexahedrons) set for the new model vehicle, an FEM model of the new model vehicle that faithfully reflects the shape difference from the existing vehicle can be acquired.

<Feature Line-based Morphing Process>

Figure 5:
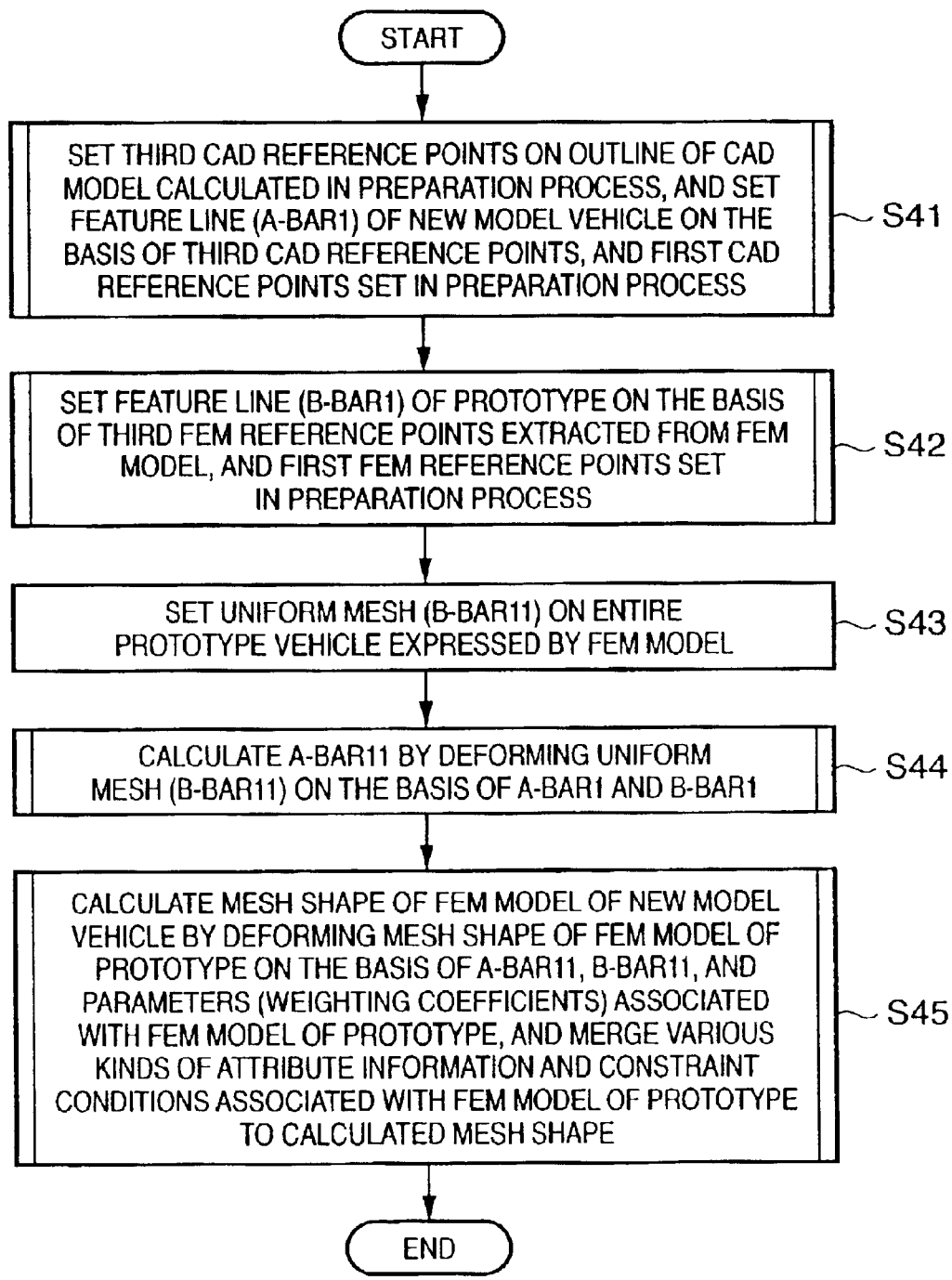
FIG. 5 is a flow chart showing details of a feature line-based morphing process (step S4 in FIG. 2) of the FEM model generation process of a new model vehicle in the embodiment of the present invention.

FIG. 5 is a flow chart showing details of the feature line-based morphing process (step S4 in FIG. 2) of the FEM model generation process of a new model vehicle in this embodiment.

Step S41 (FIG. 5): A plurality of third CAD reference points are set on the outline of the CAD model, which is calculated in the preparation process (FIG. 3), and a feature line (A-BAR1) of the new model vehicle is set on the basis of these third CAD reference points, and the first CAD reference points set in the preparation process.

Note that the individual third CAD reference points may be manually designated by the user or may be set by appropriately and automatically dividing the outline of the new model vehicle, which is obtained by connecting the plurality of first CAD reference points. At this time, a large number of third CAD reference points are preferably extracted to attain arithmetic operations with higher precision.

Step S42: A feature line (B-BAR1) of the existing vehicle is set on the basis of the first FEM reference points set in the preparation process (FIG. 3), and third FEM reference points extracted from the FEM model of the existing vehicle.

Note that the individual third FEM reference points may be manually designated by the user or may be set by appropriately and automatically dividing the outline of the existing vehicle, which is obtained by connecting the plurality of first FEM reference points.

Figure 24:
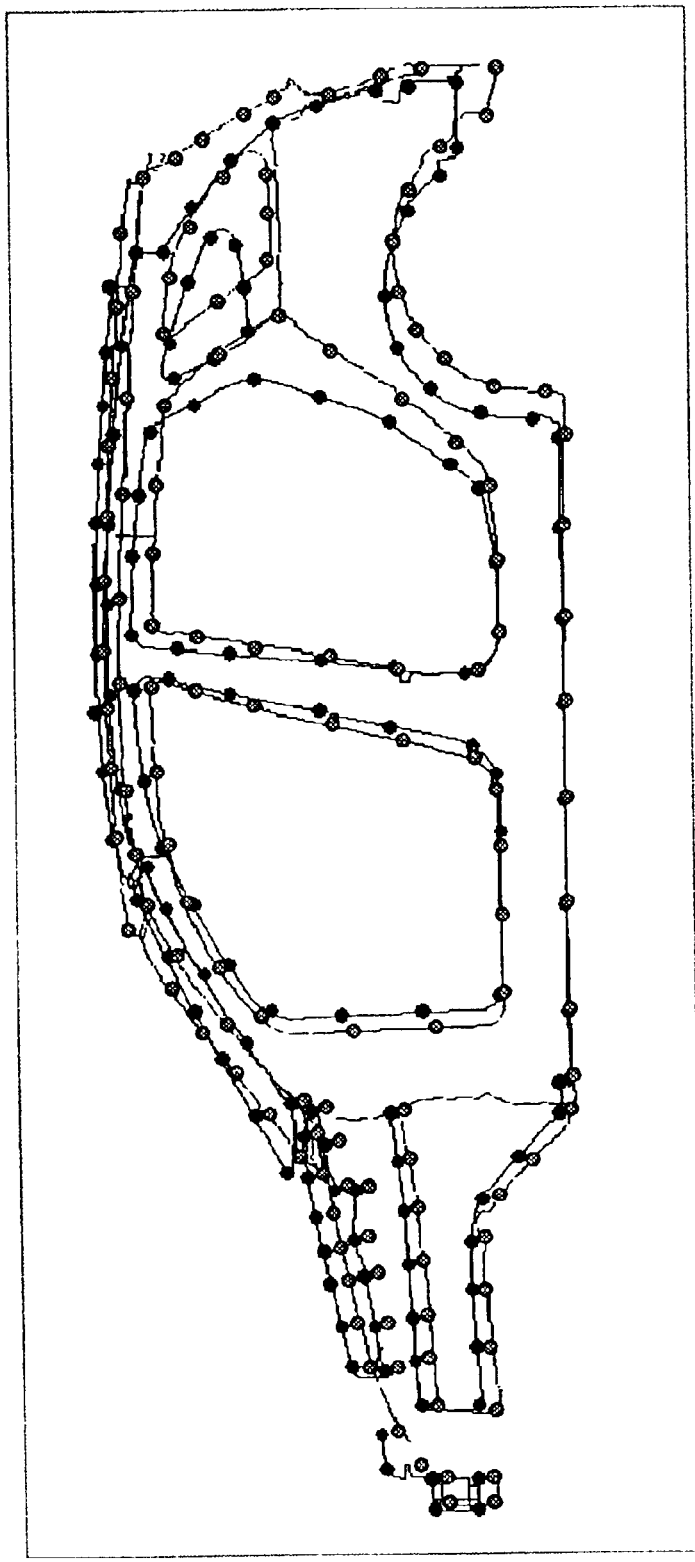
FIG. 24 shows an overlap state in a common 3D coordinate space of the feature line (A-BAR1) of a new model vehicle set with first and third CAD reference points, and the feature line (B-BAR1) of an existing vehicle set with first and third FEM reference points.

FIG. 24 shows an overlap state in a common 3D coordinate space of the feature line (A-BAR1) of the new model vehicle set with the first and third CAD reference points, and the feature line (B-BAR1) of the existing vehicle set with the first and third FEM reference points.

Step S43: As in the uniform mesh (B-BOX11: FIGS. 18 and 19) in step S33 in FIG. 4, a uniform mesh (B-BAR11: not shown) is automatically set for the entire existing vehicle expressed by the FEM model by a general method.

Step S44: By deforming the uniform mesh (B-BAR11) in accordance with the shape difference between the two different feature lines A-BAR1 and B-BAR1, A-BAR11 (not shown) is calculated.

That is, since the feature lines A-BAR1 and B-BAR1 include the corresponding first CAD reference points and first FEM reference points, and corresponding third CAD reference points and third FEM reference points, moving vectors (directions and sizes) from the first and third FEM reference points to the first and third CAD reference points, which respectively correspond to each other, are uniquely obtained as in the aforementioned box-based morphing process.

Hence, in step S44, nodes corresponding to the first and third FEM reference points of a plurality of nodes that form the uniform mesh (B-BAR11) are moved to the first and third CAD reference points. Upon moving other nodes near these first and third FEM reference points (to be referred to as nearby nodes hereinafter), the moving amounts (moving distances) from the nodes corresponding to the first and third FEM reference points are used.

More specifically, by calculating the weighted mean of the moving amounts of the already moved (already calculated) first and third FEM reference points, which are located near a given nearby node, the moving amount of that nearby node is calculated, and the nearby node is moved according to the calculated moving amount. A-BAR11 can be calculated via these two procedures. Note that A-BAR11 calculated in this step is a mesh shape similar to A-BOX11 calculated in step S34 in FIG. 4.

Step S45: As in step S35 in FIG. 4, if the plurality of first and third FEM reference points include a reference point which deviates (offsets) from nodes that form B-BAR11, a node near this reference point is adjusted to be located on that reference point. Likewise, if the plurality of first and third CAD reference points include a reference point which deviates (offsets) from nodes that form A-BAR11, a node near this reference point is adjusted to be located on that reference point (if the deviation amount is large, a plurality of surrounding nodes are preferably moved as needed). Such adjustment of the node positions is preparation for implementing high-precision morphing, and is preferably executed especially when the user manually sets the first FEM reference points and/or first CAD reference points.

Further, in step S45, by deforming the mesh shape of the FEM model of the existing vehicle (prototype) on the basis of the weighting coefficients determined according to the parameters associated with the FEM model, and A-BAR11 and B-BAR11 that have undergone node position adjustment, as in step S35 in FIG. 4, the mesh model of a FEM model of the new model vehicle is calculated. In addition, in accordance with movement of nodes (i.e., a plurality of nodes which form a first mesh shape included in the FEM model of the existing vehicle) to the calculated mesh shape (i.e., a second mesh shape to be included in the FEM model of the new model vehicle), additional information which is associated with the FEM model of the existing vehicle and includes various kinds of attribute information, boundary conditions, constraint conditions, and the like, is re-defined (merged) with respect to a plurality of nodes that form the second mesh shape, thereby calculating a data set of the FEM model (FIG. 23) of the new model vehicle. The calculated FEM model of the new model vehicle is displayed on the display of the user terminal 1 in step S5, as described above.

In step S45, the setup window shown in FIG. 10, which has been explained in the box-based morphing process (FIG. 4), is displayed prior to deformation of the mesh shape of the FEM model, and the user can make a morphing setup of the A-pillar at the second viewpoint using that setup window.

In the aforementioned feature line-based morphing process, since morphing that accurately reflects the shape difference between two different vehicles expressed by the feature line (B-BAR1: first feature line) set for the existing vehicle, and the feature line (A-BAR1: second feature line) set for the new model vehicle is done based on these feature lines without disturbing the shape that characterizes the design of the entire vehicle, the FEM model of the new model vehicle that faithfully reflects the shape difference from the existing vehicle can be acquired.

<Result Notification/Adjustment Process>

The result notification/adjustment process will be described in detail below.

Figure 6:
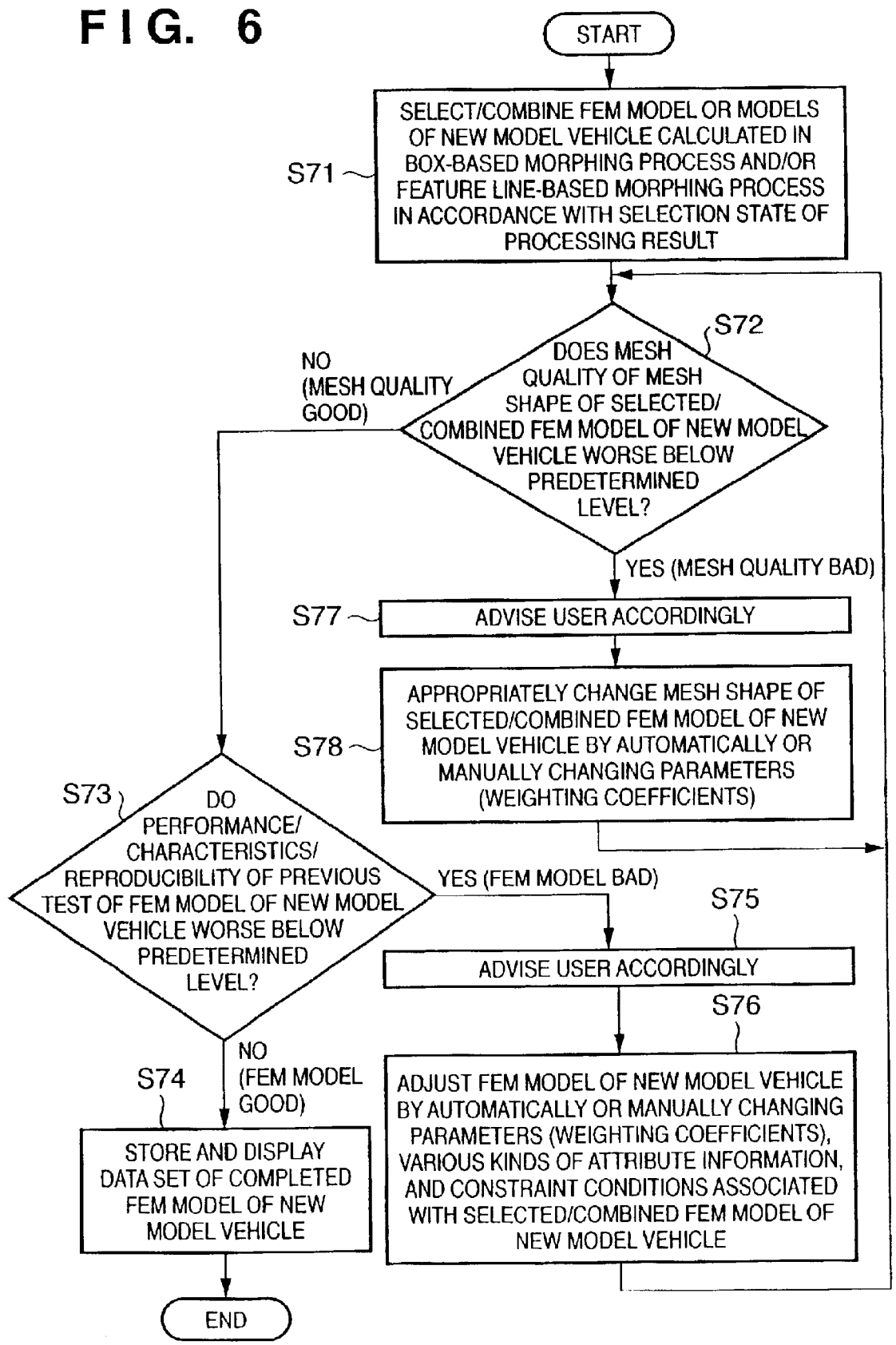
FIG. 6 is a flow chart showing details of a result notification/adjustment process (step S7 in FIG. 2) of the FEM model generation process of a new model vehicle in the embodiment of the present invention.

FIG. 6 is a flow chart showing details of a result notification/adjustment process (step S7 in FIG. 2) of the FEM model generation process of a new model vehicle in this embodiment.

Step S71 in FIG. 6: The FEM models or model of the new model vehicle, which are/is calculated by the box-based morphing process and/or feature line-based morphing process, are/is selected/combined in accordance with the selection state of the processing result in step S6 (FIG. 2).

In this step, upon combining the FEM models of the new model vehicle calculated in both the box- and feature line-based morphing processes into one FEM model, it is preferable that the morphing result obtained using boxes be used for, e.g., portions with large areas such as a roof, engine hood, and the like, and the morphing result obtained using feature lines be used near the outline of the new model vehicle. In this case, in a region where two different morphing results neighbor in one combined FEM model, a data selection process for gradually decreasing correlation from one morphing result region to the other morphing result region is preferably executed for the two different morphing results in a band region of a predetermined width, which has a boundary between the neighboring results as the center. In such case, an FEM model of the new model vehicle, which is more suitably used in analysis processes executed later can be acquired.

Step S72: It is checked by a general method if the mesh quality (distortion and the like of meshes) of a plurality of 3D (e.g., tetrahedral or hexahedral) solid elements (solid meshes) that form the mesh shape of the selected/combined FEM model of associated with the new model vehicle has worsened below a predetermined level. If the mesh quality is good, the flow advances to step S73; otherwise, the flow advances to step S77.

Steps S73 and S74: It is checked if the reproducibility of the performance/characteristics/previous tests of the data set of the FEM model associated with the new model vehicle has worsened below a predetermined level (step S73). If the FEM model is bad, the flow advances to step S75; otherwise, a message indicating this is displayed on the display of the user terminal 1, and the data set of the FEM model associated with the new model vehicle is stored in the FEM model D/B 3 (step S74), thus ending the process.

Steps S75 and S76: Since it is determined in step S73 that the FEM model is bad, a message indicating this is sent to the user (step S75), and that FEM model is adjusted by appropriately changing the parameters (weighting coefficients) associated with the FEM model of the new model vehicle and additional information such as various kinds of attribute information, constraint conditions, and the like automatically or manually (step S76). The flow then returns to step S72. In a preferred embodiment, if the additional information and the like are automatically adjusted in step S76, notification is preferably made to allow the user to recognize the changed values.

As the method of checking the quality of the FEM model in step S73, and the method of adjusting the FEM model which is executed in step S76 if the checking result is not good, the following sequences may be used.

That is, upon checking the quality of rigidity as characteristics of parts, which form that new model vehicle, in the FEM model associated with the new model vehicle, which is generated by the aforementioned morphing process, the rigidity of each part may be simulated, and it may be checked if the rigidity of each part of the new model vehicle represented by the simulation result becomes worse than the simulation result of the rigidity of an identical part in the FEM model of the existing vehicle below a predetermined level.

If the checking result is not satisfactory, the weighting coefficient used upon morphing the part of interest (and other surrounding parts as needed) may be changed to a smaller value, or the plate thickness may be changed to a larger value.

On the other hand, upon checking the weight as characteristics of the new model vehicle, the weight of each part may be simulated, and it may be checked if the weight of each part of the new model vehicle represented by the simulation result becomes larger than the simulation result of the weight of an identical part in the FEM model of the existing vehicle beyond a predetermined level.

If the checking result is not satisfactory, the weighting coefficient used upon morphing the part of interest (and other surrounding parts as needed) may be changed to a smaller value, or the plate thickness may be changed to a smaller value.

In the coping procedure in the above two examples, the method of adjusting the weighting coefficient is premised that when the quality of the FEM model of the existing vehicle is good, and that of the FEM model of the new model vehicle generated by the morphing process according to this embodiment is not good, if the weighting coefficient to be referred to upon re-calculation is automatically changed to a smaller value as needed, since movement of nodes upon morphing is restricted, the FEM model of the new model vehicle calculated using the adjusted weighting coefficient becomes closer to that of the existing vehicle with good quality.

Figure 11A:
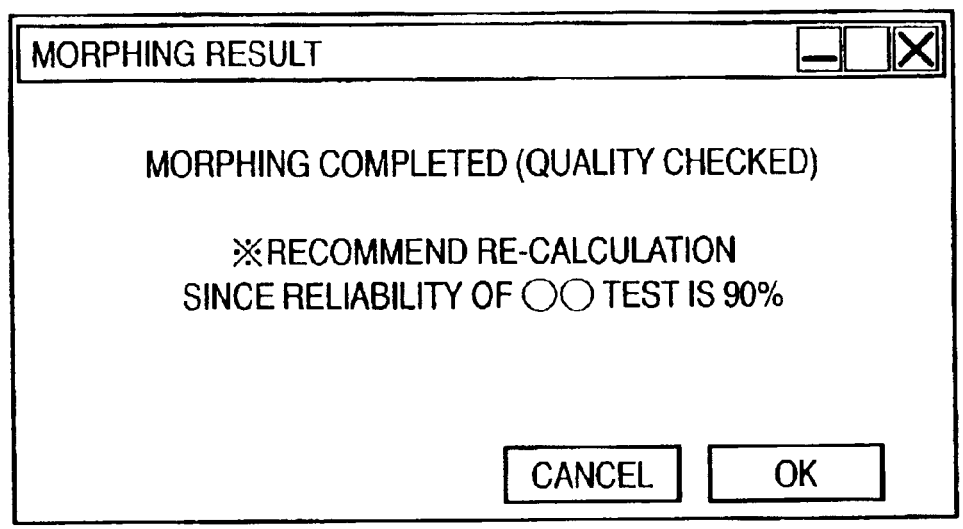
FIGS. 11A and 11B show display windows used to inform the user of the morphing result.
Figure 11B:
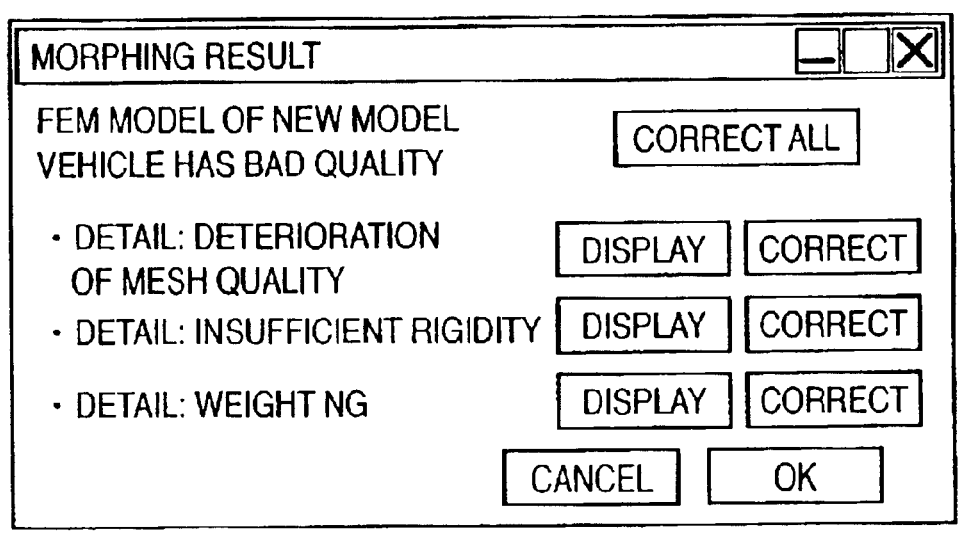

FIGS. 11A and 11B show an example of a display window for notifying the user of the morphing result. This display window notifies the user that automatic or manual adjustment is required since the calculated morphing result indicates bad quality.

If the user has selected an operation button "OK" on the display window shown in FIG. 11A, the process in step S76 begins to be executed; if the user has selected an operation button "cancel", for example, the result notification/adjustment process ends, and the flow may return to step S1 or S2 mentioned above.

On the display window shown in FIG. 11B, the user himself or herself can manually correct some or all of the mesh shape, additional information, and the like of the FEM model of the new model vehicle as the morphing result. If the user has selected an operation button "display" on this display window, a portion with bad quality is emphasized upon display, and the user can change that portion to a desired shape or value on that display window (not shown). For example, if the user has selected an operation button "OK", the flow returns to step S72; if the user has selected an operation button "cancel", the result notification/adjustment process ends, and the flow may return to step S1 or S2 mentioned above.

Note that various performance evaluation test results associated with the existing vehicles include the results of tests which have already been conducted using actual vehicles like crash tests to be conducted in the laboratory of the vehicle manufacturer having a measurement environment of various data, in addition to simulation results using a computer. In such case, upon developing a new model vehicle (especially, a derived vehicle) based on the existing vehicle, the same types of tests as those to be conducted using actual vehicles need not often be newly conducted.

By contrast, even when a new model vehicle is developed on the basis of the existing vehicle, it is often obvious that some evaluation tests to be conducted using actual vehicles yield different test results. In such case, actual tests of target performance evaluation items must be newly and reliably conducted.

Hence, in this embodiment, in order to automatically determine one of the above cases, and notify the user of it, it is checked in association with a given portion of the existing vehicle that has previously undergone the actual performance evaluation test if the mesh shape of the FEM model of the existing vehicle matches or is similar to that of the FEM model of the new model vehicle generated by the process of this embodiment. Then, the presence/absence of necessity of a plurality of different performance evaluation tests to be actually conducted such as a crash test, side-crash test, and the like as the performance of the new model vehicle is automatically determined in accordance with the checking result (that is, if that portion is not similar to that of the existing vehicle, new tests are required), and the user is preferably notified of this determination result together with the morphing result.

Steps S77 and S78: Since it is determined in step S72 that the mesh shape of the FEM model of the new model vehicle is bad, a message indicating this is sent to the user (step S77), and that mesh shape is appropriately changed by changing the parameters (weighting coefficients) automatically or manually (step S78). The flow then returns to step S72.

The contents of the message sent to the user in step S77 are limited to the mesh shape of the FEM model of the new model vehicle. In this case, the display window shown in FIGS. 11A and 11B may be displayed on the display of the user terminal 1.

As described above, according to this embodiment, although the FEM model of the existing vehicle, which is prepared in advance, and the CAD model of the new model vehicle have different data formats, the FEM model of the new model vehicle as a result of the aforementioned calculations is a data set which has the same data format as that of the existing vehicle, and can be directly set and used in solvers of various analysis processes such as mechanical strength analysis, thermal analysis, mechanism analysis, vibration analysis, and the like.

That is, if the user of the user terminal 1 can prepare for the FEM model of an existing vehicle (prototype structure) and at least outer shape information of a new model vehicle (structure to be analyzed), he or she can quickly and easily acquire the FEM model of the new model vehicle associated with additional information which includes boundary conditions, constraint condition, attribute information representing materials, and the like, without any setup operations of various conditions and the like, which are required in the conventional system, prior to analysis processes of that new model vehicle on the basis of the finite element method. In this manner, the FEM model of the existing vehicle, which is already present, can be effectively utilized, and the whole analysis jobs of the new model vehicle can be speeded up.

In this embodiment, since the weighting coefficients to be referred to upon execution of morphing are determined in accordance with parameters that the user sets using the setup windows shown in FIGS. 7A to 7C to FIGS. 9A and 9B, an FEM model of the practical new model vehicle according to user's wish can be acquired, and any quality drop of the FEM model of the new model vehicle compared to the quality of the FEM model of the existing vehicle can be minimized. Such effects are notable when the new model vehicle is a so-called derived vehicle similar to the existing vehicle.

In this embodiment, when the calculated FEM model and mesh shape of the new model vehicle have bad quality, a message indicating this is sent to the user, and the FEM model and mesh shape can be manually or automatically adjusted as needed. In this manner, the user can be prevented from analyzing the new model vehicle using a low-quality FEM model later.

In this embodiment, when the quality of the calculated FEM model of the new model vehicle (e.g., the degree of distortion of a mesh model, parts performance and characteristics, and the like) becomes worse than a predetermined level, calculations are automatically redone until a high-quality FEM model of the new model vehicle that can be used in the analysis processes is acquired, thus improving user's convenience. Hence, the user can be prevented from analyzing the new model vehicle using a low-quality FEM model later.

In the above embodiment, the FEM model generation process of a new model vehicle has been explained with reference to a plurality of drawings, for the sake of simplicity. However, display windows corresponding to all these drawings need not be displayed on the display of the user terminal 1.

Note that the present invention that has been exemplified using the above embodiment is achieved by supplying a computer program that can implement the functions of the flow charts used in the above description to the aforementioned host computer 2, and reading out and executing that program by a CPU of the host computer 2. The computer program supplied to the host computer 2 may be stored in a storage device such as a programmable memory, hard disk device, or the like.

In the former case, as the method of supplying the computer program to each apparatus, currently prevalent sequences such as a method of installing the program in the apparatus via various recording media such as a flexible disk and the like, a method of downloading the program from an external apparatus via a communication line such as the Internet or the like, and the like can be adopted. In such case, the present invention is constituted by a code of such computer program or a storage medium.

<Operations and Effects of Embodiment>

(1) In the aforementioned embodiment, in order to implement morphing of a structure shape using a computer, a method comprises:

the preparation step of acquiring at least outer shape information of a structure to be analyzed (a body structure of a derived vehicle, which is derived from an existing vehicle), and a FEM model (FIG. 12), which is generated in advance using a pre-processor of an analysis solver on the basis of a finite element method (FEM), and includes a three-dimensional mesh model that represents an outer shape of a prototype structure (a body structure of an existing vehicle) and additional information (boundary conditions, constraint conditions, and attribute information indicating materials and the like) associated with the mesh model, and setting a plurality of corresponding reference points on the outer shape information of the structure to be analyzed and the mesh model of the prototype structure; and the morphing step of calculating a FEM model (FIG. 23) of the structure to be analyzed by moving a plurality of nodes which form the mesh model of the prototype structure on the basis of correspondence between the plurality of reference points set on the mesh model of the prototype structure and the outer shape information of the structure to be analyzed, so as to change the mesh model to an outer shape of the structure to be analyzed, and merging the additional information and associated state thereof with respect to the deformed mesh model.

According to this arrangement, a morphing method of a structure shape, which can quickly and easily acquire the FEM model of a structure to be analyzed using that of a prototype structure, its computer program, and a computer-readable storage medium can be provided.

That is, according to this arrangement, if the user can prepare for the FEM model of a prototype structure and at least outer shape information of a structure to be analyzed, he or she can quickly and easily acquire the FEM model of the structure to be analyzed associated with additional information which includes boundary conditions, constraint condition, attribute information representing materials, and the like, without any setup operations of various conditions and the like, which are required in the conventional system, prior to analysis processes of that structure to be analyzed on the basis of the finite element method. In this manner, the FEM model of the prototype structure, which is already present, can be effectively utilized, and the whole analysis jobs of the structure to be analyzed can be speeded up.

(2) In this embodiment that discloses the above arrangement, the preparation step includes the parameter setting step of allowing a user to set parameters used to determine weighting coefficients so as to be associated with the FEM model of the prototype structure using various setup windows shown in FIGS. 7A to 7C to FIGS. 9A and 9B, and upon moving the plurality of nodes which form the mesh model of the prototype structure in the morphing step, moving amounts of the nodes are restricted in accordance with the weighting coefficients determined based on the parameters.

Note that the weighting coefficients are preferably determined in accordance with:

parts shapes such as ridge lines, outline, branch lines (branch portions), corner radii (R), and the like, which are included in the FEM model of the prototype structure;

parts layouts such as gaps between parts, seat attachment position, and the like, which are included in the FEM model of the prototype structure;

parts characteristics specified by the plate thickness, spot, weight, specifications, size, volume (fuel tank or the like), welding position, and the like, which are included in the FEM model of the prototype structure; and parts types such as ribs, flanges, common parts, alternate parts, and the like, which are included in the FEM model of the prototype structure.

For example, in the morphing step, the weighting coefficients may be determined in accordance with the previous analysis result using the FEM model of the prototype structure. More specifically, for example, a weighting coefficient used to restrict a change in shape of a ridge line is preferably determined in accordance with the analysis results of a crash test, NVH, and the like; and a weighting coefficient used to restrict a change in shape of a gap between a door and body is preferably determined in accordance with the analysis results of a side-crash test, and the like.

With the above arrangement, the weighting coefficients are determined in accordance with parameters set by the user, as exemplified in claims 4 to 8, and a change in shape of the mesh model of the prototype structure is restricted in accordance with the weighting coefficients. As a result, an FEM model of the practical structure to be analyzed according to user's wish can be acquired, and any quality drop of the FEM model of the structure to be analyzed compared to the quality of the FEM model of the prototype structure can be minimized.

(3) In either case, in a preferred embodiment, the morphing step preferably includes:

the master mesh generation step of generating a master mesh (FIG. 22), which represents a change in shape from an outer shape of the prototype structure to an outer shape of the structure to be analyzed, in accordance with correspondence between the plurality of reference points set on the mesh model of the prototype structure and the outer shape information of the structure to be analyzed; and the FEM model calculation step of calculating the FEM model of the structure to be analyzed by moving the plurality of nodes which form the mesh model of the prototype structure on the basis of a layout state of a plurality of nodes which form the master mesh, so as to change the mesh model to the outer shape of the structure to be analyzed, and merging the additional information and associated state thereof with respect to the deformed mesh model.

(i) In this case, the master mesh generation step preferably includes:

the first hexahedron setting step of setting, in accordance with the plurality of reference points set on the mesh model of the prototype structure, a plurality of first hexahedrons, each of which includes at least one of the reference points as a vertex;

the second hexahedron setting step of setting, in accordance with the plurality of reference points set on the outer shape information of the structure to be analyzed, a plurality of second hexahedrons, which correspond to the first hexahedrons, and each of which includes at least one of the reference points as a vertex; and the generation step of generating the master mesh, which represents the change in shape from the outer shape of the prototype structure to the outer shape of the structure to be analyzed, in accordance with differences between shapes of the corresponding ones of the plurality of first and second hexahedrons.

Note that the plurality of reference points correspond to first FEM reference points shown in FIG. 14, first CAD reference points shown in FIG. 15, first and second FEM reference points shown in FIG. 16, and first and second CAD reference points shown in FIG. 17 in the above embodiment (box-based morphing process).

(ii) Or the master mesh generation step preferably includes:

the first feature line setting step of setting, in accordance with the plurality of reference points set on the mesh model of the prototype structure, a first feature line which includes the reference points on a line;

the second feature line setting step of setting, in accordance with the plurality of reference points set on the outer shape information of the structure to be analyzed, a second feature line which includes the reference points on a line; and the generation step of generating the master mesh, which represents the change in shape from the outer shape of the prototype structure to the outer shape of the structure to be analyzed, in accordance with differences between shapes of the first and second feature lines.

Note that the plurality of reference points set in the preparation step correspond to first FEM reference points shown in FIG. 14, first CAD reference points shown in FIG. 15, first and third FEM reference points shown in FIG. 24, and first and third CAD reference points shown in FIG. 24 in the above embodiment (feature line-based morphing process).

According to the above arrangement, a high-precision FEM model of the structure to be analyzed can be calculated using a master mesh, which is calculated according to a plurality of first and second hexahedrons or first and second feature lines set using a plurality of reference points set on a mesh model of the prototype structure and outer shape information of the structure to be analyzed, and which represents a change in shape from the outer shape of the prototype structure to that of the structure to be analyzed.

(4) In the morphing method of a structure shape according to this embodiment, when quality of the FEM model of the structure to be analyzed calculated in the morphing step deteriorates below a predetermined level, the user can be notified of deterioration of quality.

According to the above arrangement, when the quality of the calculated FEM model of the structure to be analyzed (e.g., the degree of distortion of a mesh model, parts performance and characteristics, and the like) worsens below a predetermined level, a message indicating this is sent to the user. Therefore, when the user appropriately adjusts the mesh model of such low-quality FEM model and additional information associated with that mesh model, or the FEM model of the prototype structure to acquire a re-calculated FEM model of the structure to be analyzed, he or she can acquire a high-quality FEM model of the structure to be analyzed that can be used in analysis processes. Hence, the user can be prevented from analyzing the structure to be analyzed using such low-quality FEM model later.

(5) In this embodiment, when quality of the FEM model of the structure to be analyzed calculated in the morphing step deteriorates below a predetermined level, the FEM model of the structure to be analyzed can be corrected by recursively calculating the FEM model of the structure to be analyzed using new weighting coefficients determined according to a deterioration level of the quality so as to satisfy at least the predetermined level.

According to this arrangement, when the quality of the calculated FEM model of the structure to be analyzed (e.g., the degree of distortion of a mesh model, parts performance and characteristics, and the like) worsens below a predetermined level, the computer 2 automatically recalculates until a high-quality FEM model of the structure to be analyzed that can be used in the analysis processes is acquired, thus improving user's convenience. Hence, the user can be prevented from analyzing the structure to be analyzed using a low-quality FEM model later, and the quality drop of the FEM model of the structure to be analyzed compared to the quality of the FEM model of the prototype structure can be minimized.

(6) In this embodiment, the user can set, at a first viewpoint, a first restriction condition upon changing a shape of the mesh model of the prototype structure to the outer shape of the structure to be analyzed in the morphing step, and can set a second restriction condition upon changing the shape at a second viewpoint different from the first viewpoint in the preparation step, and the first and second restriction conditions are reflected in the morphing step upon calculating the FEM model of the structure to be analyzed.

That is, in the morphing step, the second constraint condition set at the second viewpoint is reflected in a range narrower than the plurality of reference points and the application range of the first constraint condition set at the first viewpoint, and is set for the sectional shape of a portion which extends in the longitudinal direction in the mesh model of the prototype structure at the first view point using the setup window shown in, e.g., FIG. 10. This second constraint condition is reflected in preference to the first constraint condition.

With the above arrangement, upon morphing from the FEM model of the prototype structure to that of the structure to be analyzed, the first constraint condition (parameters used to determine weighting coefficients and a plurality of corresponding reference points) and the second constraint condition reflected in a range narrower than the application range of the first constraint condition, are reflected. In this manner, an impractical deformed shape can be easily prevented from being calculated for even a portion of the structure to be analyzed. Also, since the second constraint condition can be easily set for a portion extending in the longitudinal direction (and, especially, its sectional shape) that the user can hardly discriminate in the mesh model of the prototype structure at the first viewpoint, an impractical deformed shape can be efficiently prevented from being calculated.

As many apparently widely different embodiments of the present invention can be made without departing from the spirit and scope thereof, it is to be understood that the invention is not limited to the specific embodiments thereof except as defined in the claims.

What is claimed is:

1. A method of morphing a structure shape using a computer, comprising:

acquiring at least outer shape information of a structure to be analyzed, and a finite element method (FEM) model, which is generated in advance using a pre-processor of an analysis solver on the basis of a FEM, and includes a three-dimensional mesh model that represents an outer shape of a prototype structure and additional information associated with the mesh model, and setting a plurality of corresponding reference points on the outer shape information of the structure to be analyzed and the mesh model of the prototype structure;

calculating a FEM model of the structure to be analyzed by moving a plurality of nodes which form the mesh model of the prototype structure on the basis of correspondence between the plurality of reference points set on the mesh model of the prototype structure and the outer shape information of the structure to be analyzed, so as to change the mesh model to an outer shape of the structure to be analyzed, and merging the additional information and associated state thereof with respect to the changed mesh model; and notifying a user of deterioration of quality when quality of the calculated FEM model of the structure to be analyzed deteriorates below a predetermined level.

2. The method according to claim 1, wherein said acquisition of at least outer shape information of a structure to be analyzed includes allowing a user to set parameters used to determine weighting coefficients so as to be associated with the FEM model of the prototype structure, and upon moving the plurality of nodes which form the mesh model of the prototype structure in said morphing step, moving amounts of the nodes are restricted in accordance with the weighting coefficients determined based on the parameters.

3. The method according to claim 2, wherein said calculation of the FEM model of the structure to be analyzed includes:

generating a master mesh, which represents a change in shape from an outer shape of the prototype structure to an outer shape of the structure to be analyzed, in accordance with correspondence between the plurality of reference points set on the mesh model of the prototype structure and the outer shape information of the structure to be analyzed; and calculating the FEM model of the structure to be analyzed by moving the plurality of nodes which form the mesh model of the prototype structure on the basis of a layout state of a plurality of nodes which form the master mesh, so as to change the mesh model to the outer shape of the structure to be analyzed, and merging the additional information and associated state thereof with respect to the changed mesh model.

4. The method according to claim 3, wherein generating the master mesh includes:

setting, in accordance with the plurality of reference points set on the mesh model of the prototype structure, a plurality of first hexahedrons, each of which includes at least one of the reference points as a vertex;

setting, in accordance with the plurality of reference points set on the outer shape information of the structure to be analyzed, a plurality of second hexahedrons, which correspond to the first hexahedrons, and each of which includes at least one of the reference points as a vertex; and generating the master mesh, which represents the change in shape from the outer shape of the prototype structure to the outer shape of the structure to be analyzed, in accordance with differences between shapes of the corresponding ones of the plurality of first and second hexahedrons.

5. The method according to claim 3, wherein generating the master mesh includes includes:

setting, in accordance with the plurality of reference points set on the mesh model of the prototype structure, a first feature line which includes the reference points on a line;

setting, in accordance with the plurality of reference points set on the outer shape information of the structure to be analyzed, a second feature line which includes the reference points on a line; and generating the master mesh, which represents the change in shape from the outer shape of the prototype structure to the outer shape of the structure to be analyzed, in accordance with differences between shapes of the first and second feature lines.

6. The method according to claim 2, wherein the weighting coefficients are determined in accordance with parts shapes included in the FEM model of the prototype structure in the calculation of the FEM model of the structure to be analyzed.

7. The method according to claim 2, wherein the weighting coefficients are determined in accordance with parts layouts included in the FEM model of the prototype structure in the calculation of the FEM model of the structure to be analyzed.

8. The method according to claim 2, wherein the weighting coefficients are determined in accordance with parts characteristics included in the FEM model of the prototype structure in calculation of the FEM model of the structure to be analyzed.

9. The method according to claim 2, wherein the weighting coefficients are determined in accordance with parts types included in the FEM model of the prototype structure in calculation of the FEM model of the structure to be analyzed.

10. The method according to claim 2, wherein the weighting coefficients are determined in accordance with previous analysis results using the FEM model of the prototype structure in the calculation of the FEM model of the structure to be analyzed.

11. The method according to claim 1, wherein the additional information includes at least one of a boundary condition, constraint condition, or attribute information indicating a material.

12. The method according to claim 1, wherein the prototype structure is a body structure of an existing vehicle, and the structure to be analyzed is a body structure of a derived vehicle, which is derived from the existing vehicle.

13. The method according to claim 1, further comprising:

correcting, when quality of the calculated FEM model of the structure to be analyzed deteriorates below a predetermined level by recursively calculating the FEM model of the structure to be analyzed using new weighting coefficients determined according to a deterioration level of the quality so as to satisfy at least the predetermined level.

14. The method according to claim 1, wherein a user sets, at a first viewpoint, a first restriction condition upon changing a shape of the mesh model of the prototype structure to the outer shape of the structure to be analyzed in said calculation of the FEM model of the structure to be analyzed, and the user can set a second restriction condition upon changing the shape at a second viewpoint different from the first viewpoint in said preparation step, and the first and second restriction conditions are reflected upon calculating the FEM model of the structure to be analyzed.

15. The method according to claim 14, wherein the second restriction condition set at the second viewpoint is reflected in a range narrower than an application range of the first restriction condition sot at the first viewpoint in said calculation of the FEM model of the structure to be analyzed.

16. The method according to claim 15, wherein the second restriction condition is set for a portion, which extends in a longitudinal direction, in the mesh model of the prototype structure at the first viewpoint.

17. The method according to claim 1, wherein calculating the FEM model of the structure to be analyzed includes:

generating a master mesh, which represents a change in shape from an outer shape of the prototype structure to an outer shape of the structure to be analyzed, in accordance with correspondence between the plurality of reference points set on the mesh model of the prototype structure and the outer shape information of the structure to be analyzed; and calculating the FEM model of the structure to be analyzed by moving the plurality of nodes which form the mesh model of the prototype structure on the basis of a layout state of a plurality of nodes which form the master mesh, so as to change the mesh model to the outer shape of the structure to be analyzed, and merging additional information and associated states thereof with respect to the changed mesh model.

18. A computer readable medium encoded with processing instructions for implementing a method of morphing of a structure shape, the method comprising:

acquiring at least outer shape information of a structure to be analyzed, and a finite element method (FEM) model, which is generated in advance using a pre-processor of an analysis solver on the basis of a FEM, and includes a three-dimensional mesh model that represents an outer shape of a prototype structure and additional information associated with the mesh model, and setting a plurality of corresponding reference points on the outer shape information of the structure to be analyzed and the mesh model of the prototype structure;

calculating a FEM model of the structure to be analyzed by moving a plurality of nodes which form the mesh model of the prototype structure on the basis of correspondence between the plurality of reference points set on the mesh model of the prototype structure and the outer shape information of the structure to be analyzed, so as to change the mesh model to an outer shape of the structure to be analyzed, and merging the additional information and associated state thereof with respect to the changed mesh model; and notifying a user of deterioration of quality when quality of the FEM model of the structure to be analyzed deteriorates below a predetermined level.

19. The computer readable medium according to claim 18, wherein the said acquisition of at least outer shape information of a structure to be analyzed includes allowing a user to set parameters used to determine weighting coefficients so as to be associated with the FEM model of the prototype structure, and upon moving the plurality of nodes which form the mesh model of the prototype structure, moving, by the program coeds for said morphing function, amounts of the nodes are restricted in accordance with the weighting coefficients determined based on the parameters.

20. The computer readable medium according to claim 19, wherein the weighting coefficients are determined in accordance with parts shapes included in the FEM model of the prototype structure in the calculation of the FEM model of the structure to be analyzed.

21. The computer readable medium according to claim 19, wherein the weighting coefficients are determined in accordance with parts layouts included in the FEM model of the prototype structure in the calculation of the FEM model of the structure to be analyzed.

22. The computer readable medium according to claim 19, wherein the weighting coefficients are determined in accordance with parts characteristics included in the FEM model of the prototype structure in the calculation of the FEM model of the structure to be analyzed.

23. The computer readable medium according to claim 19, wherein the weighting coefficients are determined in accordance with parts types included in the FEM model of the prototype structure in the calculation of the FEM model of the structure to be analyzed.

24. The computer readable medium according to claim 19, wherein the weighting coefficients are determined in accordance with previous analysis results using the FEM model of the prototype structure in the calculation of the FEM model of the structure to be analyzed.

25. The computer readable medium according to claim 18, further comprising:

correcting, when quality of the calculated FEM model of the structure to be analyzed deteriorates below a predetermined level, the FEM model of the structure to be analyzed by recursively calculating The FEM model of the structure to be analyzed using new weighting coefficients determined according to a deterioration level of the quality so as to satisfy at least the predetermined level.

26. The computer readable medium according to claim 18, wherein a user sets, at a first viewpoint, a first restriction condition upon changing a shape of the mesh model of the prototype structure to the outer shape of the structure to be analyzed by the program codes for said calculation of the FEM model of the structure to be analyzed, and the user can set a second restriction condition upon changing the shape at a second viewpoint different from the first viewpoint by the program coeds for said acquisition of at least outer shape information of the structure to be analyzed, and the first and second restriction conditions are reflected, upon calculating the FEM model of the structure to be analyzed.

27. The computer readable medium according to claim 26, wherein the second restriction condition set at the second viewpoint is reflected in a range narrower than an application range of the first restriction condition set at the first viewpoint in said calculation of the FEM model of the structure to be analyzed.

28. The computer readable medium according to claim 27, wherein the second restriction condition is set for a portion, which extends in a longitudinal direction, in the mesh model of the prototype structure at the first viewpoint.

29. The computer readable medium according to claim 18, wherein calculating the FEM model of the structure to be analyzed includes:
- generating a master mesh, which represents a change in shape from an outer shape of the prototype structure to an outer shape of the structure to be analyzed, in accordance with correspondence between the plurality of reference points set on the mesh model of the prototype structure and the outer shape information of the structure to be analyzed; and
- calculating the FEM model of the structure to be analyzed by moving the plurality of nodes which form the mesh model of the prototype structure on the basis of a layout state of a plurality of nodes which form the master mesh, so as to change the mesh model to the outer shape of the structure to be analyzed, and merging the additional information and associated state thereof with respect to the changed mesh model.

30. The method according to claim 12, wherein said quality is reproducibility of tests.

31. The computer readable medium according to claim 18, wherein
- the prototype structure is a body structure of an existing vehicle,
- the structure to be analyzed is a body structure of a derived vehicle, which is derived from the existing vehicle, and
- said quality is reproducibility of previous tests.

* * * * *

UNITED STATES PATENT AND TRADEMARK OFFICE
CERTIFICATE OF CORRECTION

PATENT NO. : 7,038,700 B2
APPLICATION NO. : 10/241497
DATED : May 2, 2006
INVENTOR(S) : Katsuya Kawaguchi et al.

It is certified that error appears in the above-identified patent and that said Letters Patent is hereby corrected as shown below:

Col. 24, line 12, delete "includes" second occurrence

Col. 24, line 39, after "in" insert --the--

Col. 24, line 44, after "in" insert --the--

Col. 25, line 16, change "sot" to --set--

Col. 26, line 7, change "coeds" to --codes--

Col. 26, line 40, change "The" to --the--

Col. 26, line 53, change "coeds" to --codes--

Signed and Sealed this

Tenth Day of April, 2007

JON W. DUDAS
*Director of the United States Patent and Trademark Office*